(12) United States Patent
Su et al.

(10) Patent No.: US 10,374,058 B2
(45) Date of Patent: Aug. 6, 2019

(54) SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: Huan-Chieh Su, Changhua County (TW); Zhi-Chang Lin, Hsinchu County (TW); Ting-Hung Hsu, Miaoli County (TW); Jia-Ni Yu, New Taipei (TW); Wei-Hao Wu, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/706,456

(22) Filed: Sep. 15, 2017

(65) Prior Publication Data

US 2019/0088762 A1 Mar. 21, 2019

(51) Int. Cl.

| H01L 29/76 | (2006.01) |
|---|---|
| H01L 29/94 | (2006.01) |
| H01L 29/66 | (2006.01) |
| H01L 27/088 | (2006.01) |
| H01L 21/8234 | (2006.01) |
| H01L 21/8238 | (2006.01) |
| H01L 27/092 | (2006.01) |

(52) U.S. Cl.
CPC ............ *H01L 29/66545* (2013.01); *H01L 21/823418* (2013.01); *H01L 21/823431* (2013.01); *H01L 21/823821* (2013.01); *H01L 27/0886* (2013.01); *H01L 27/0924* (2013.01); *H01L 29/6681* (2013.01)

(58) Field of Classification Search
CPC .......... H01L 29/66795; H01L 27/0886; H01L 21/823431; H01L 29/66545; H01L 21/02532; H01L 21/823418
USPC ....................................................... 257/401
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |

(Continued)

OTHER PUBLICATIONS

U.S. Appl. No. 15/635,337, filed Jun. 28, 2017.

*Primary Examiner* — Theresa T Doan
(74) *Attorney, Agent, or Firm* — Maschoff Brennan

(57) ABSTRACT

A method for manufacturing a semiconductor device is provided. The method for manufacturing a semiconductor device includes forming a gate electrode layer in a gate trench; filling a recess in the gate electrode layer with a dielectric feature; and etching back the gate electrode layer from top end surfaces of the gate electrode layer while leaving a portion of the gate electrode layer under the dielectric feature.

20 Claims, 22 Drawing Sheets

(56) References Cited

U.S. PATENT DOCUMENTS

| | | | |
|---|---|---|---|
| 2003/0025135 A1* | 2/2003 | Matsumoto | H01L 29/66636 257/288 |
| 2007/0104862 A1* | 5/2007 | Lai | H01L 21/28061 427/97.4 |
| 2011/0156107 A1* | 6/2011 | Bohr | H01L 21/76831 257/288 |
| 2018/0108646 A1* | 4/2018 | Lee | G11C 11/40 |
| 2018/0190785 A1* | 7/2018 | Hung | H01L 29/4983 |

* cited by examiner

SEMICONDUCTOR DEVICE AND METHOD FOR MANUFACTURING THE SAME

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed in a free standing manner over a major surface of a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
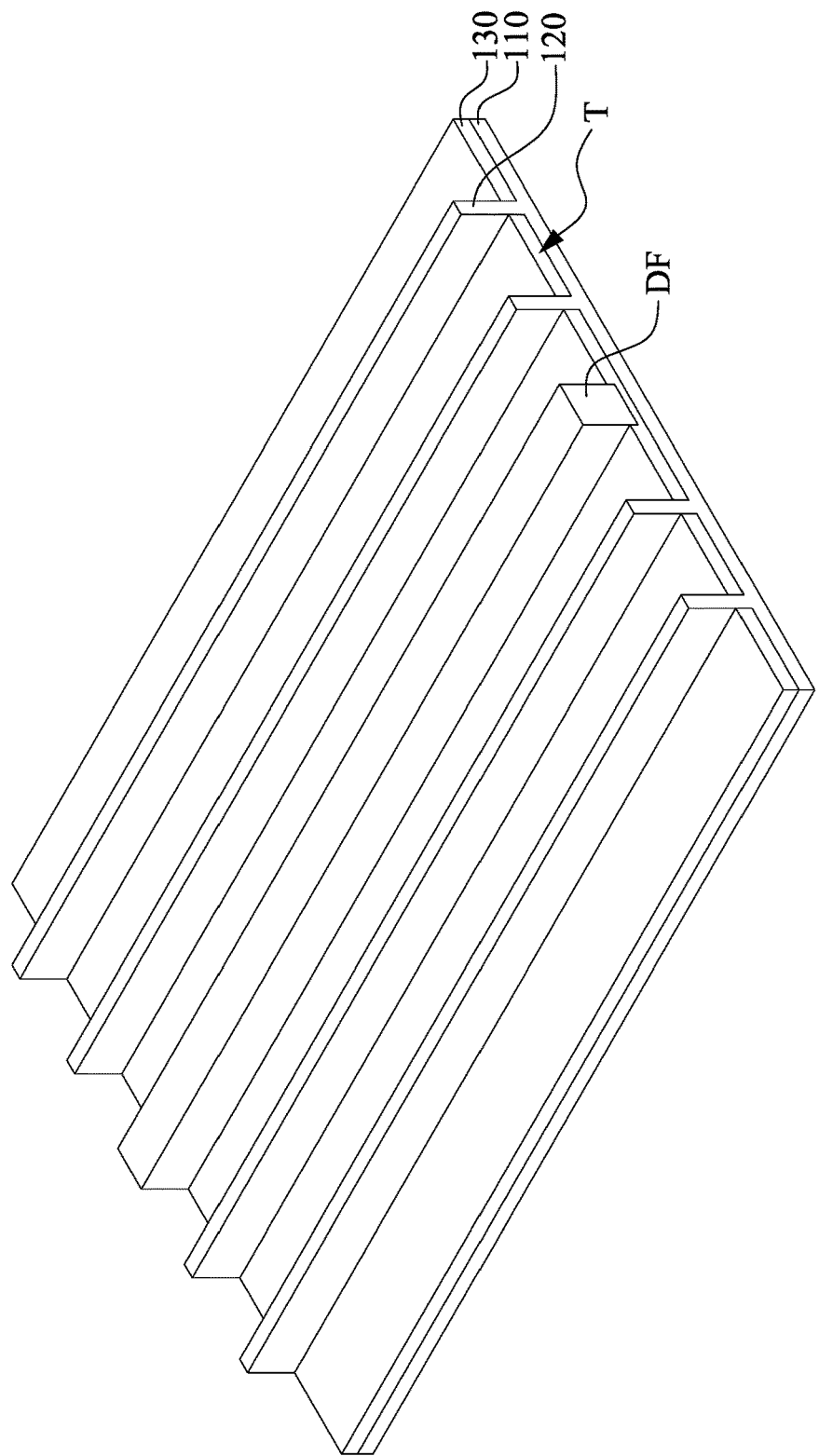
FIG. 1 to FIG. 22 illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 to FIG. 22 illustrate a method for manufacturing a semiconductor device at various stages in accordance with some embodiments of the present disclosure. Reference is made to FIG. 1. A substrate 110 is illustrated. In some embodiments, the substrate 110 may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 110 is etched to form the trenches T, and a portion of the substrate 110 between neighboring trenches T can be referred to as the semiconductor fin 120. Trenches T may be trench strips that are substantially parallel to each other. Similarly, the semiconductor fins 120 are substantially parallel to each other.

Isolation dielectrics 130 are formed in the trenches T respectively, so as to separate the semiconductor fins 120 from each other. In some embodiments, the isolation dielectric 130 is made of silicon oxide, silicon nitride, silicon oxynitride, fluoride-doped silicate glass (FSG), or other low-K dielectric materials. In some embodiments, the isolation dielectric 130 can have a multi-layer structure, for example, a thermal oxide liner layer with silicon nitride formed over the liner. The isolation dielectrics 130 may be formed by forming a dielectric layer covering the semiconductor fins 120 and filling the trenches T, removing a portion of the dielectric layer outside the trenches T, and recessing the remaining dielectric layer. Herein, a top surface of the semiconductor fins 120 is higher than a top surface of the isolation dielectrics 130, such that the semiconductor fins 120 protrude above the isolation dielectrics 130.

It is understood that the processes described above are some examples of how semiconductor fins 120 and the shallow trench isolation (STI) structure are formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, at least one of the semiconductor fins 120 can be recessed, and a material different from the recessed semiconductor fin 120 may be epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. In some embodiments, at least one of the semiconductor fins 120 may include silicon germanium ($Si_x Ge_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In some embodiments, at least one dummy fin DF is formed in at least one of the trenches T. To be specific, a portion of the dummy fin DF is embedded in the isolation dielectrics 130, and a top surface of the dummy fin DF is higher than the top surface of the isolation dielectrics 130, such that the dummy fin DF protrudes above the isolation dielectrics 130. The dummy fin DF provides a top surface substantially level with the top surface of the semiconductor fin 120. In some other embodiments, the dummy fin DF may be omitted.

The dummy fin DF is made of silicon oxide, silicon nitride, silicon oxynitride, or other low-K dielectric materials. In some embodiments, exemplary formation of the dummy fin DF may include recessing one of the isolation dielectrics 130, forming a dummy dielectric layer over isolation dielectrics 130 to fill the recess of the one of the isolation dielectrics 130, then removing a horizontal portion of the dummy dielectric layer, and then etching back the isolation dielectrics 130.

Figure 2:
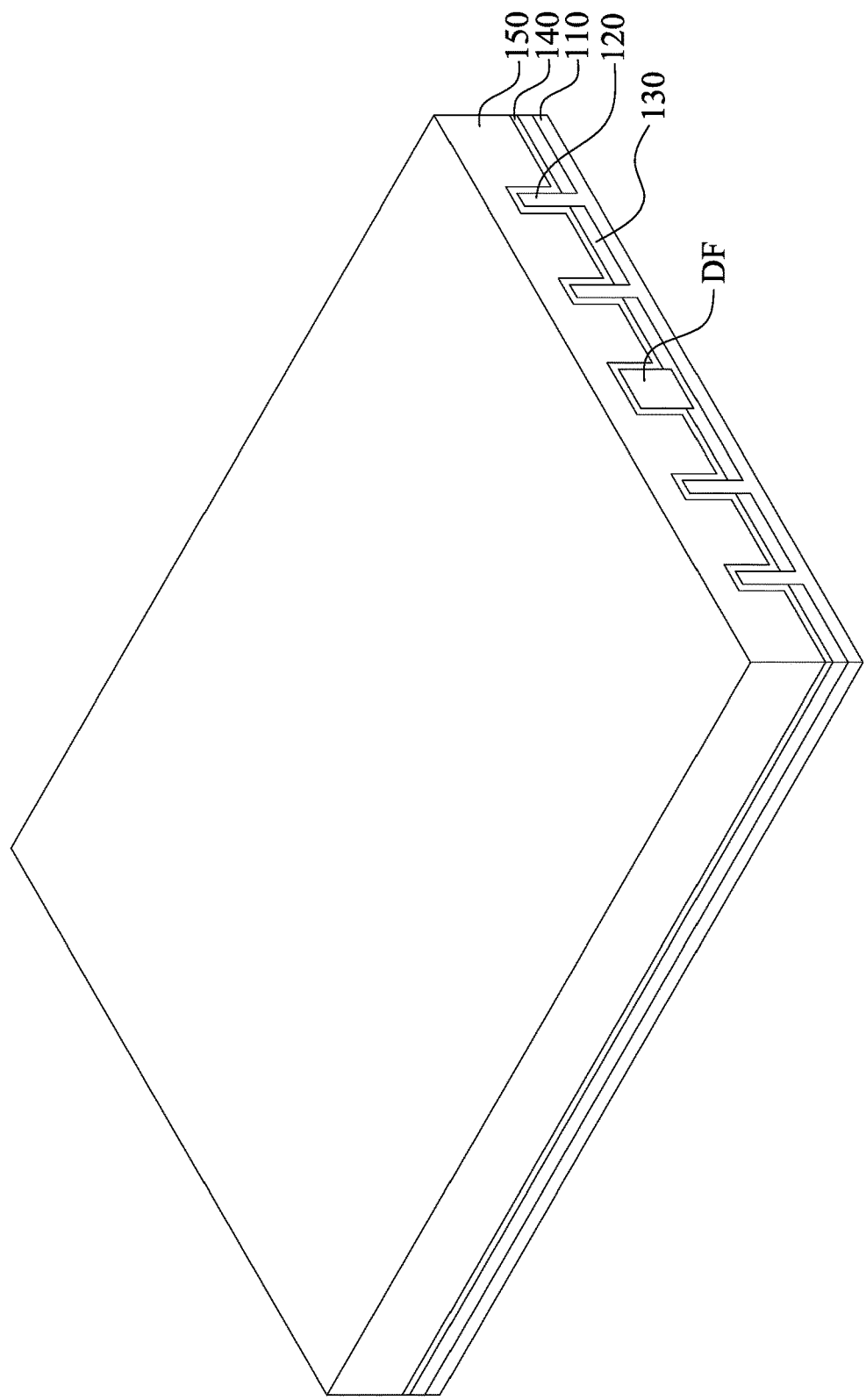

Reference is made to FIG. 2. A gate dielectric layer 140 is blanket formed over the substrate 110 to cover the semiconductor fins 120, the dummy fin DF, and the isolation dielectric 130. In some embodiments, the gate dielectric layer 140 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 140 is an oxide layer. The gate dielectric layer 140 may be formed by a deposition processes, such as chemical vapor deposition (CVD), physical vapor deposition (PVD), atomic layer deposition (ALD), plasma enhanced CVD (PECVD) or other suitable techniques.

After the gate dielectric layer 140 is formed, a dummy gate electrode layer 150 is formed over the gate dielectric layer 140. In some embodiments, the dummy gate electrode layer 150 may include polycrystalline-silicon (poly-Si), poly-crystalline silicon-germanium (poly-SiGe), metallic nitrides, metallic silicides, metallic oxides, or metals. In some embodiments, the dummy gate electrode layer 150 includes a metal-containing material such as TiN, TaN, TaC, Co, Ru, Al, combinations thereof, or multi-layers thereof. The dummy gate electrode layer 150 may be deposited by CVD, physical vapor deposition (PVD), sputter deposition, or other techniques suitable for depositing conductive materials.

Figure 3:
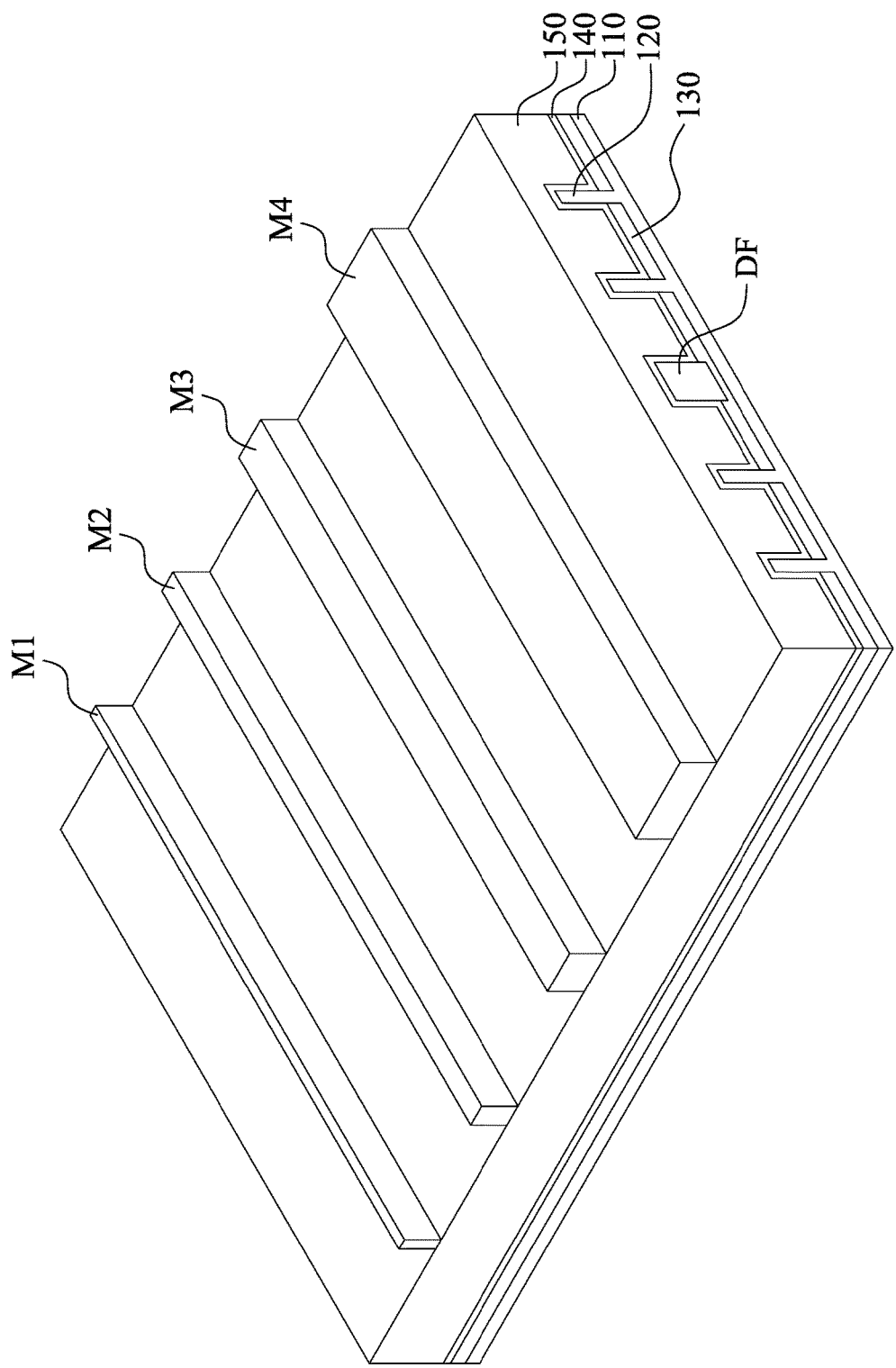

Next, the dummy gate electrode layer 150 and the gate dielectric layer 140 are patterned to form dummy gate structures DG1-DG4 in accordance with some embodiments. For example, as shown in FIG. 3, a patterned mask (e.g., masks M1-M4) is formed over a portion of the dummy gate electrode layer 150. The patterned mask (e.g., masks M1-M4) may be a hard mask for protecting the underlying dummy gate electrode layer 150 and the gate dielectric layer 140 against subsequent etching process. The patterned mask (e.g., masks M1-M4) may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 4:
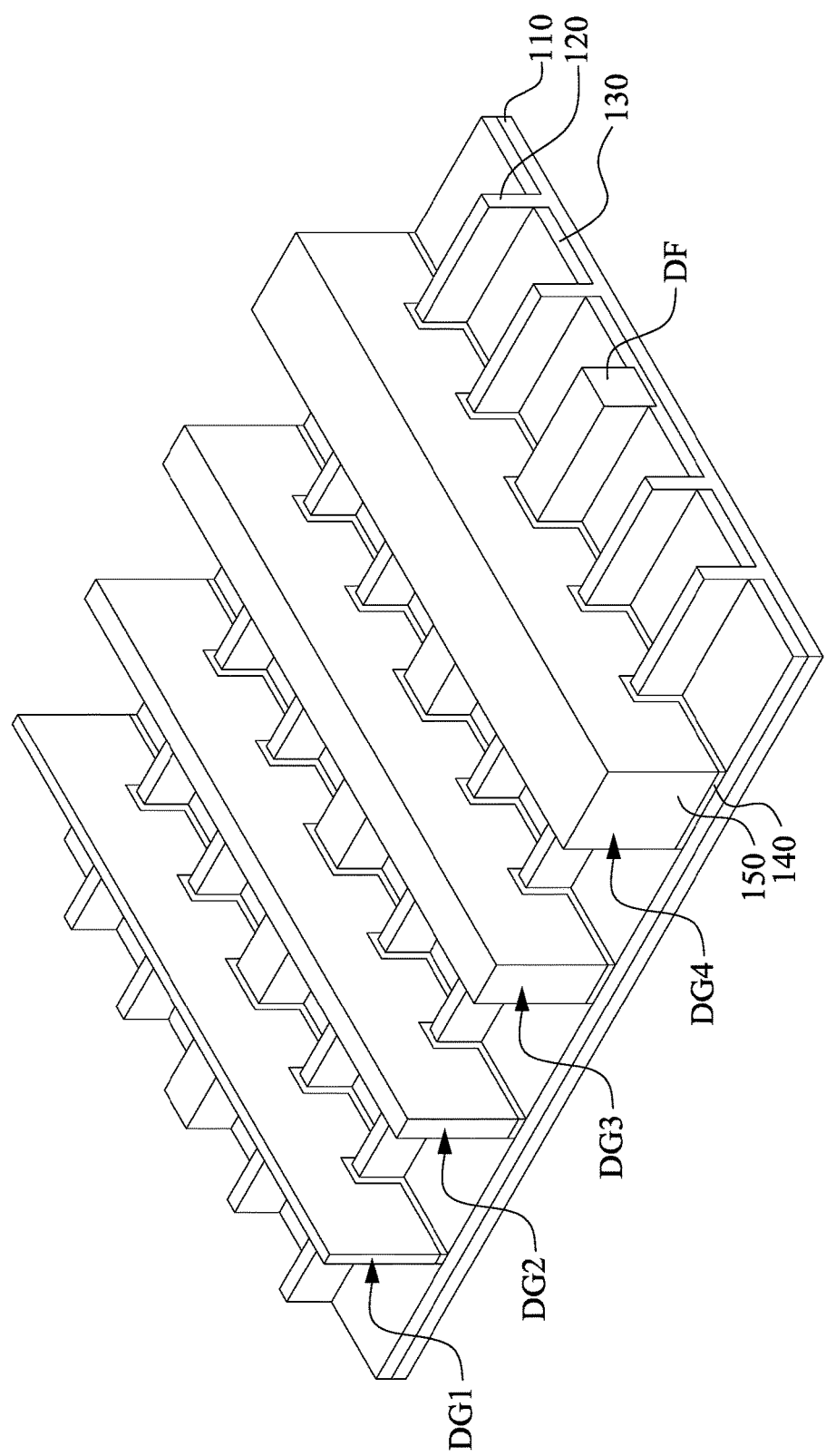

An etching process is performed to form dummy gate structures DG1-DG4 wrapping the semiconductor fins 120 using the masks M1-M4 as an etching mask, and the masks M1-M4 are removed after the etching. The resulting structure is shown in FIG. 4. Each dummy gate structure DG1-DG4 includes a gate dielectric layer 140 and a dummy gate electrode layer 150 over the gate dielectric layer 140. The dummy gate structures DG1-DG4 have substantially parallel longitudinal axes that are substantially perpendicular to longitudinal axes of the semiconductor fins 120. The dummy gate structures DG1-DG4 will be replaced with a replacement gate structure using a "gate-last" or replacement-gate process. The dummy gate structures DG1-DG4 are respectively formed over channel regions in the substrate 110. For convenience of illustration, the dummy gate structures DG1-DG4 are depicted to have different widths, which are related different channel lengths respectively. Herein, the dummy gate structures DG1-DG4 are arranged in a sequence from a short one to a long one. For example, the dummy gate structures DG4 has a width greater than that of the dummy gate structures DG1.

Figure 5:
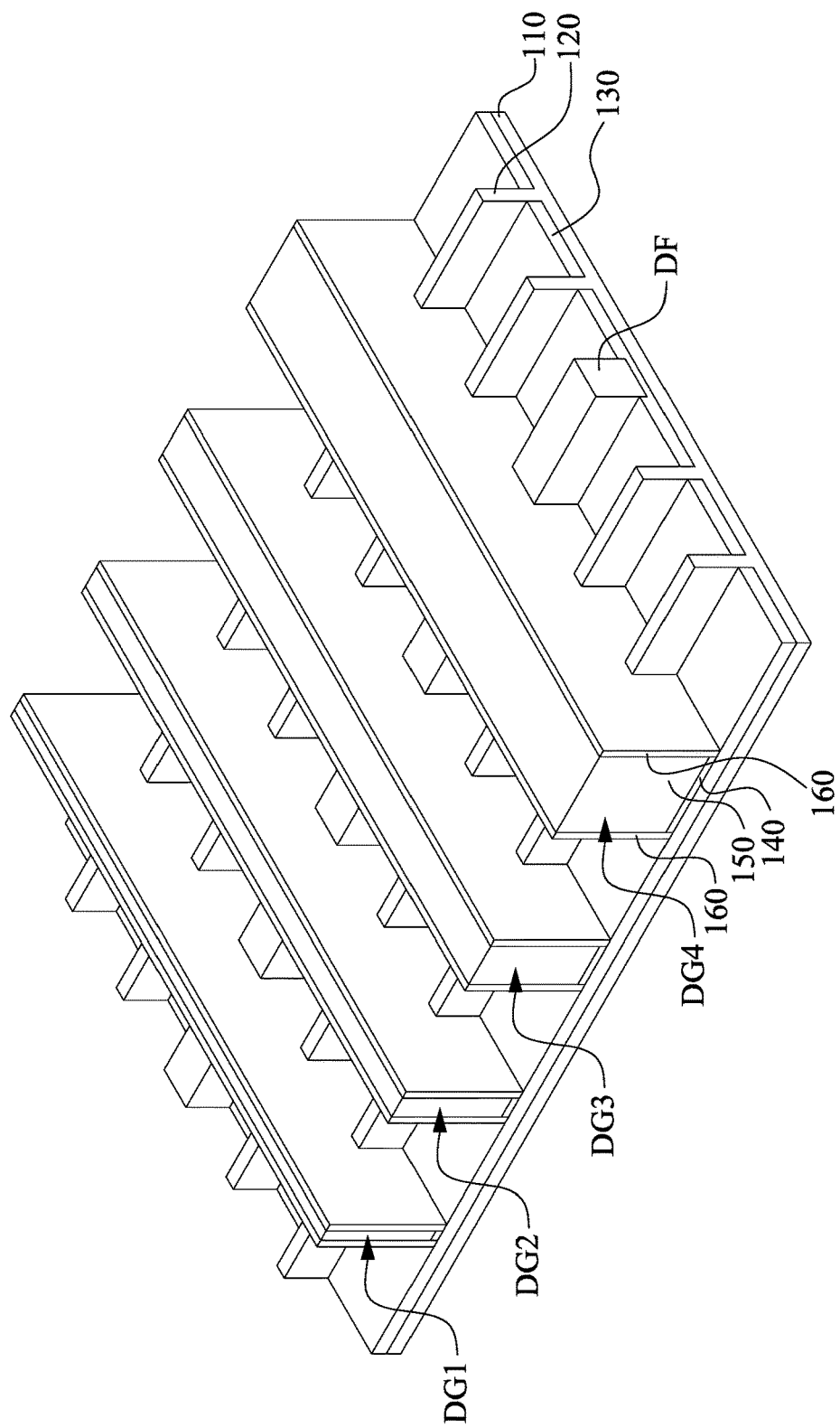

Reference is made to FIG. 5. Gate spacers 160 are formed on opposite sidewalls of the dummy gate structures DG1-DG4. In some embodiments, the gate spacers 160 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 160 may include a single layer or multilayer structure made of different dielectric materials. The method of forming the gate spacers 160 includes blanket forming a dielectric layer on the structure shown in FIG. 8 using, for example, CVD, PVD or ALD, and then performing an etching process such as anisotropic etching to remove horizontal portions of the dielectric layer. The remaining portions of the dielectric layer on sidewalls of the dummy gate structures DG1-DG4 can serve as the gate spacers 160. In some embodiments, the gate spacers 160 may be used to offset subsequently formed doped regions, such as source/drain regions. The gate spacers 160 may further be used for designing or modifying the source/drain region profile.

Figure 6:
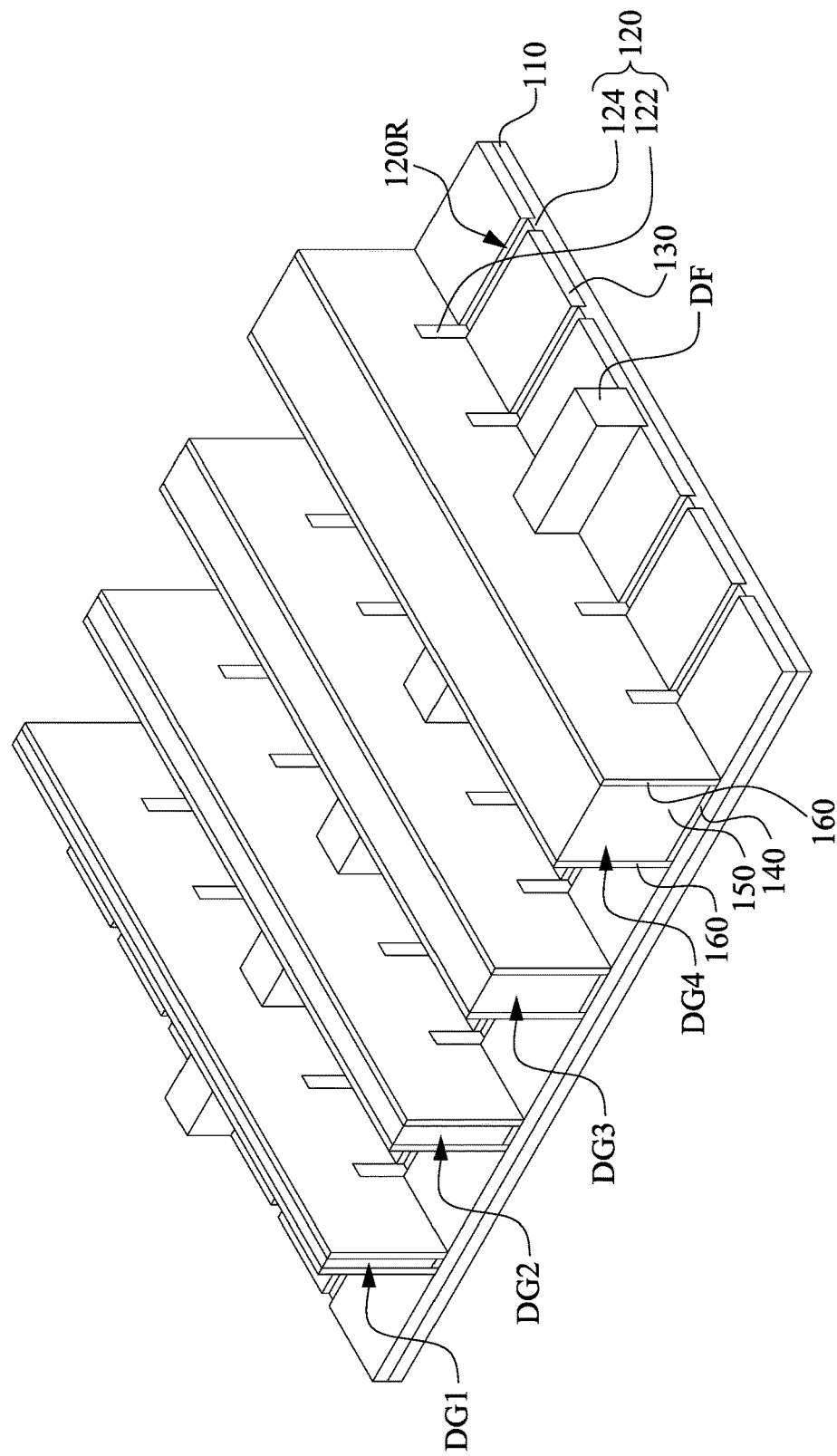

Reference is made to FIG. 6. Portions of the semiconductor fins 120 not covered by the dummy gate structures DG1-DG4 and the gate spacers 160 are respectively partially removed (or partially recessed) to form recesses 120R. The remaining semiconductor fin 120 may have a protruding portion 122 and embedded portions 124 after this removal. The embedded portions 124 are embedded in the isolation dielectric 130, and the embedded portions 124 are exposed by the recesses 120R. The protruding portion 122 protrudes from the embedded portions 124 and is located between the recesses 120R. The dummy gate structures DG1-DG4 wrap the protruding portions 122, and hence the protruding portions 122 can act as channel regions of transistors. The embedded portions 124 spaced apart from the dummy gate structures DG1-DG4 can act as source/drain regions of transistors.

Formation of the recesses 120R may include a dry etching process, a wet etching process, or combination dry and wet etching processes. This etching process may include reactive ion etch (RIE) using the dummy gate structures DG1-DG4 and gate spacers 160 as masks, or by any other suitable removal process. In some embodiments, the etching process may be performed, for example, under a pressure of about 1 mTorr to 1000 mTorr, a power of about 10 W to 1000 W, a bias voltage of about 20 V to 500 V, at a temperature of about 40° C. to 60° C., using a HBr and/or $Cl_2$ as etch gases. After the etching process, a pre-cleaning process may be performed to clean the recesses 120R with hydrofluoric acid (HF) or other suitable solution in some embodiments.

Figure 7:
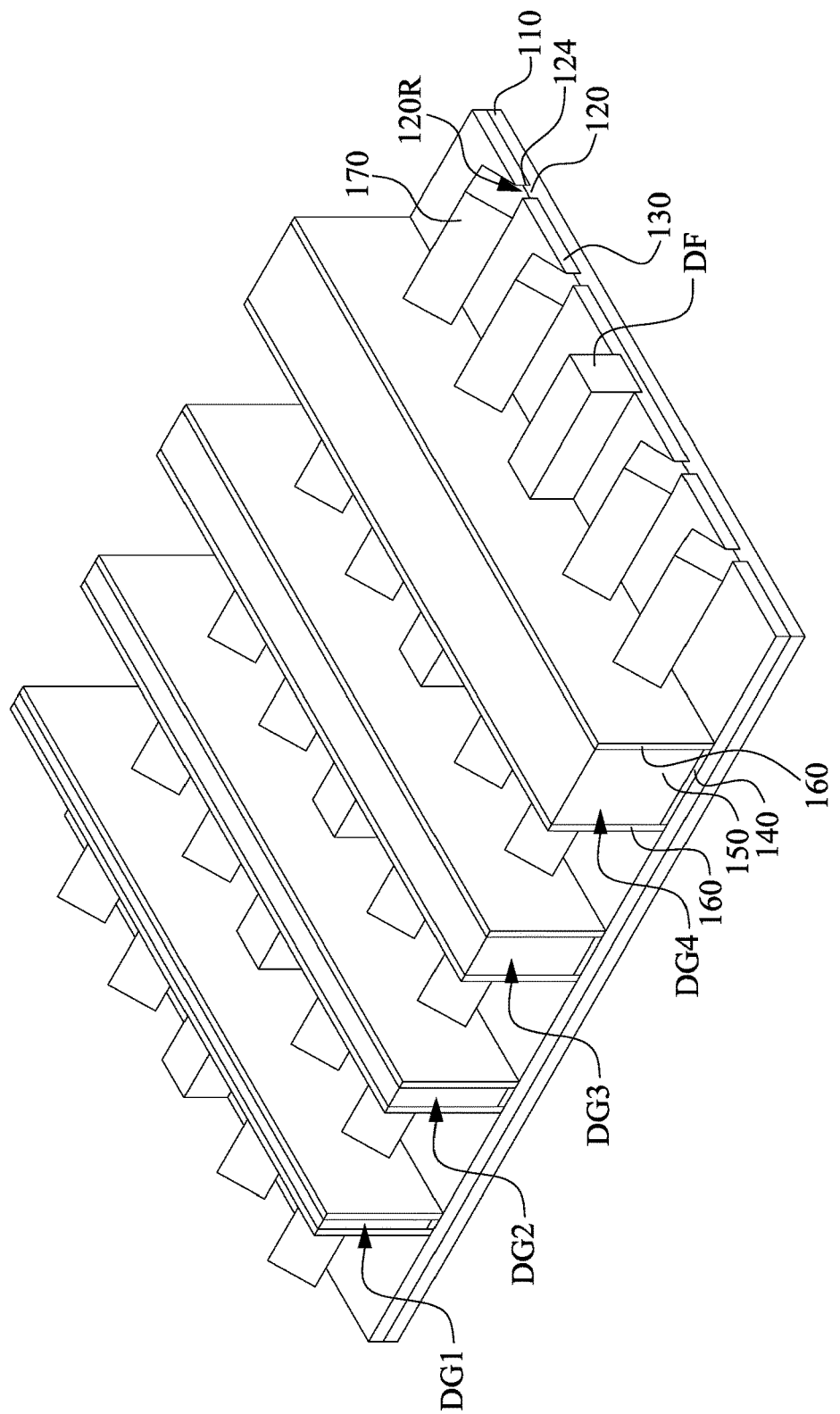

Reference is made to FIG. 7. Epitaxial source/drain structures 170 are respectively formed in the recesses 120R. The epitaxial source/drain structures 170 may be formed using one or more epitaxy or epitaxial (epi) processes, such that Si features, SiGe features, silicon phosphate (SiP) features, silicon carbide (SiC) features and/or other suitable features can be formed in a crystalline state on the embedded portions 124 of the semiconductor fins 120. In some embodiments, lattice constants of the epitaxial source/drain structures 170 are different from that of the semiconductor fins 120, so that the channel region between the epitaxial source/drain structures 170 can be strained or stressed by the epitaxial source/drain structures 170 to improve carrier mobility of the semiconductor device and enhance the device performance.

Specifically, the electron mobility increases and the hole mobility decreases when the tensile strain is applied in the channel region, and the electron mobility decreases and the hole mobility increases when the compress strain is applied in the channel region. Therefore, an n-type transistor with a stressor configured to provide tensile strain in the channel region would be beneficial, and a p-type transistor with a stressor configured to provide compress strain in the channel region would be beneficial as well. For example, in some embodiments where two source/drain structures 170 are used to form an n-type transistor, the source/drain structures 170 can act as stressors including, for example, SiP, SiC or SiCP, which is able to induce tensile strain to an n-type channel; in some embodiments where two source/drain structures 170 are used to form a p-type transistor, the source/drain structures 170 may include stressors including SiGe, which is able to induce compress strain to a p-type channel.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 120 (e.g., silicon, silicon germanium, silicon phosphate, or the like). The epitaxial source/drain structures 170 may be in-situ doped. The doping species include p-type dopants, such as boron or $BF_2$; n-type dopants, such as phosphorus or arsenic; and/or other suitable dopants including combinations thereof. If the epitaxial source/drain structures 170 are not in-situ doped, a second implantation process (i.e., a junction implant process) is performed to dope the epitaxial source/drain structures 170. One or more annealing processes may be performed to activate the epitaxial source/drain structures 170. The annealing processes include rapid thermal annealing (RTA) and/or laser annealing processes.

Figure 8:
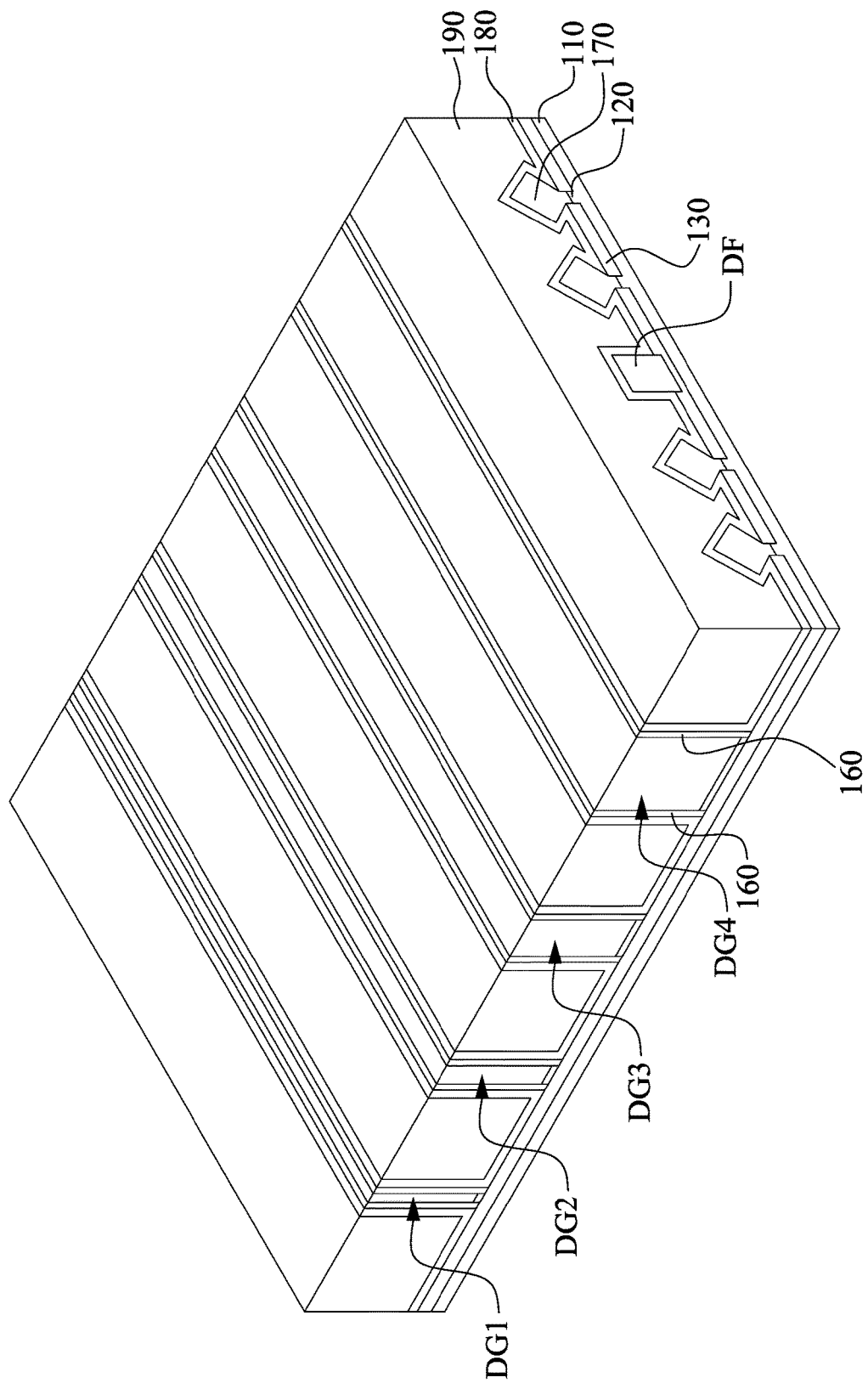

Reference is made to FIG. 8. A contact etch stop layer (CESL) 180 is blanket formed on the structure shown in FIG. 7, and then, an interlayer dielectric (ILD) layer 190 is formed on the CESL 180. Afterwards, a CMP process may be optionally performed to remove excessive material of the ILD layer 190 and the CESL 180 to expose the dummy gate structures DG1-DG4. The CMP process may planarize a top surface of the ILD layer 190 with top surfaces of the dummy gate structures DG1-DG4, gate spacers 160 and the CESL 180 in some embodiments. The CESL 180 includes silicon nitride, silicon oxynitride or other suitable materials. The CESL 180 can be formed using, for example, plasma enhanced CVD, low pressure CVD, ALD or other suitable techniques. The ILD layer 190 may include a material different from the CESL 180. In some embodiments, the ILD layer 190 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 190 may be formed using, for example, CVD, ALD, spin-on-glass (SOG) or other suitable techniques.

Figure 9:
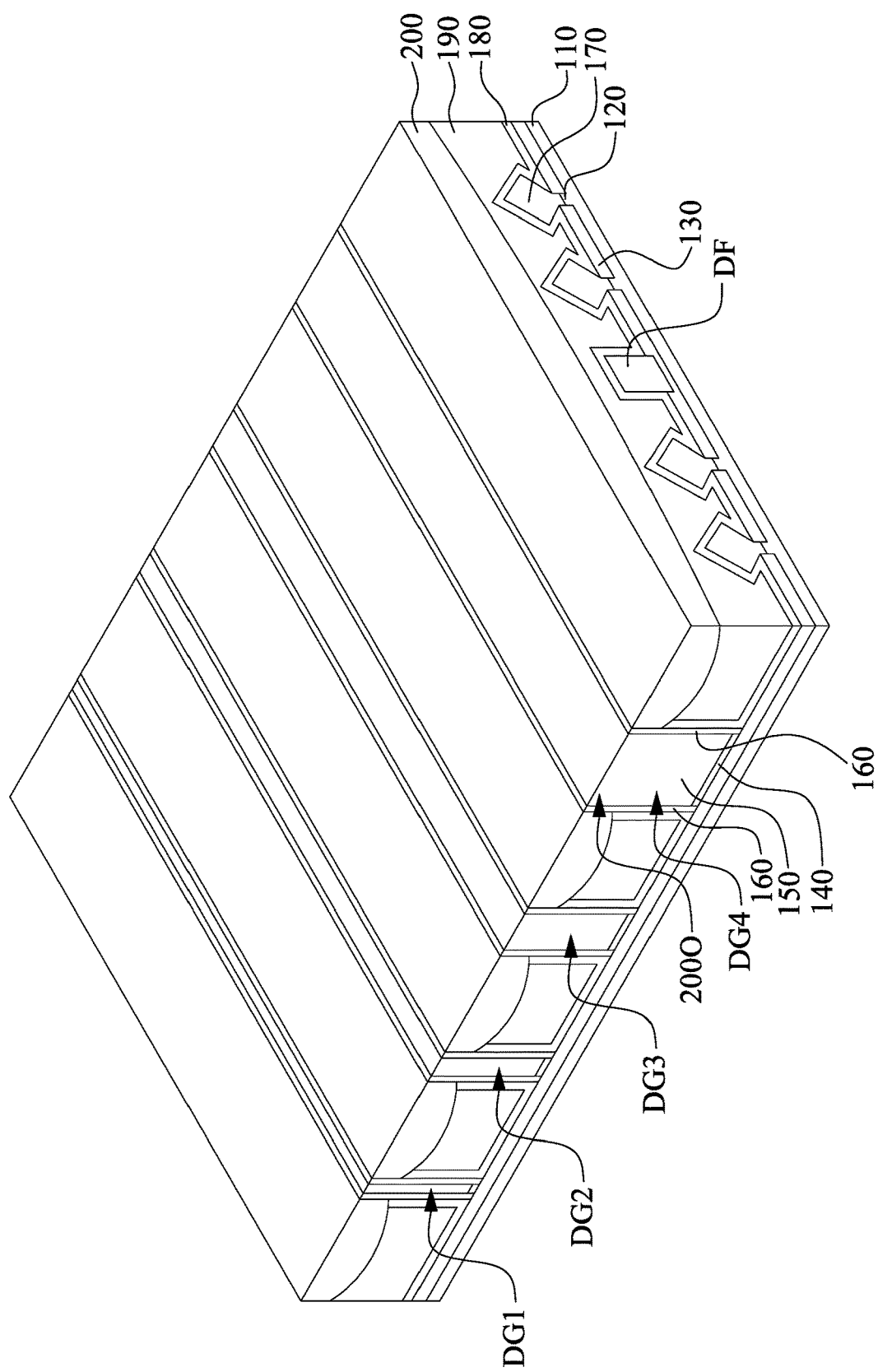

FIG. 9 illustrate the formation of a cap layer 200 over the ILD layer 190. Herein, the cap layer 200 is formed over the embedded portions 124 of the semiconductor fins 120 (referring to FIG. 6). The cap layer 200 is made of silicon nitride (SiN), silicon oxycarbide (SiOC), silicon oxycarbonitride (SiOCN), or the combination thereof. Herein, a portion of the ILD layer 190 and a portion of the CESL 180 are removed to form recesses, and the cap layer 200 is formed over the remaining ILD layer 190 and the CESL 180, and fills the recesses. Afterward, a CMP process may be optionally performed to remove excessive material of the cap layer 200 to expose the dummy gate structures DG1-DG4. The CMP process may planarize a top surface of the cap layer 200 to level up with top surfaces of the dummy gate structures DG1-DG4, gate spacers 160 and the CESL 180 in some embodiments. The formed cap layer 200 surrounds the dummy gate electrode of the dummy gate structures DG1-DG4, and may have capping openings 200O exposing the dummy gate structures DG1-DG4 respectively. In some other embodiments, the cap layer 200 may be omitted, and the semiconductor device may not include the cap layer 200.

Figure 10:
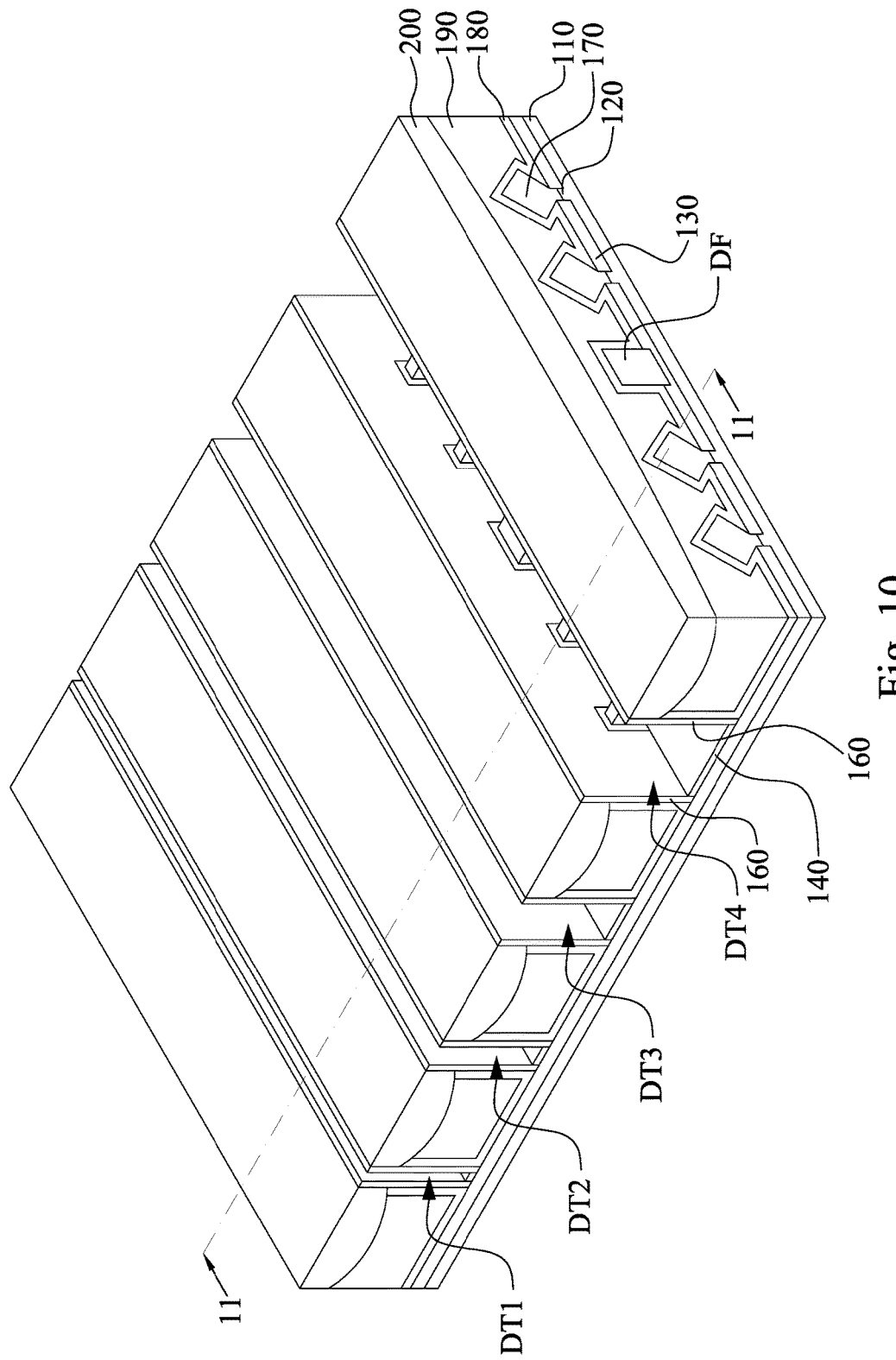
Figure 11:
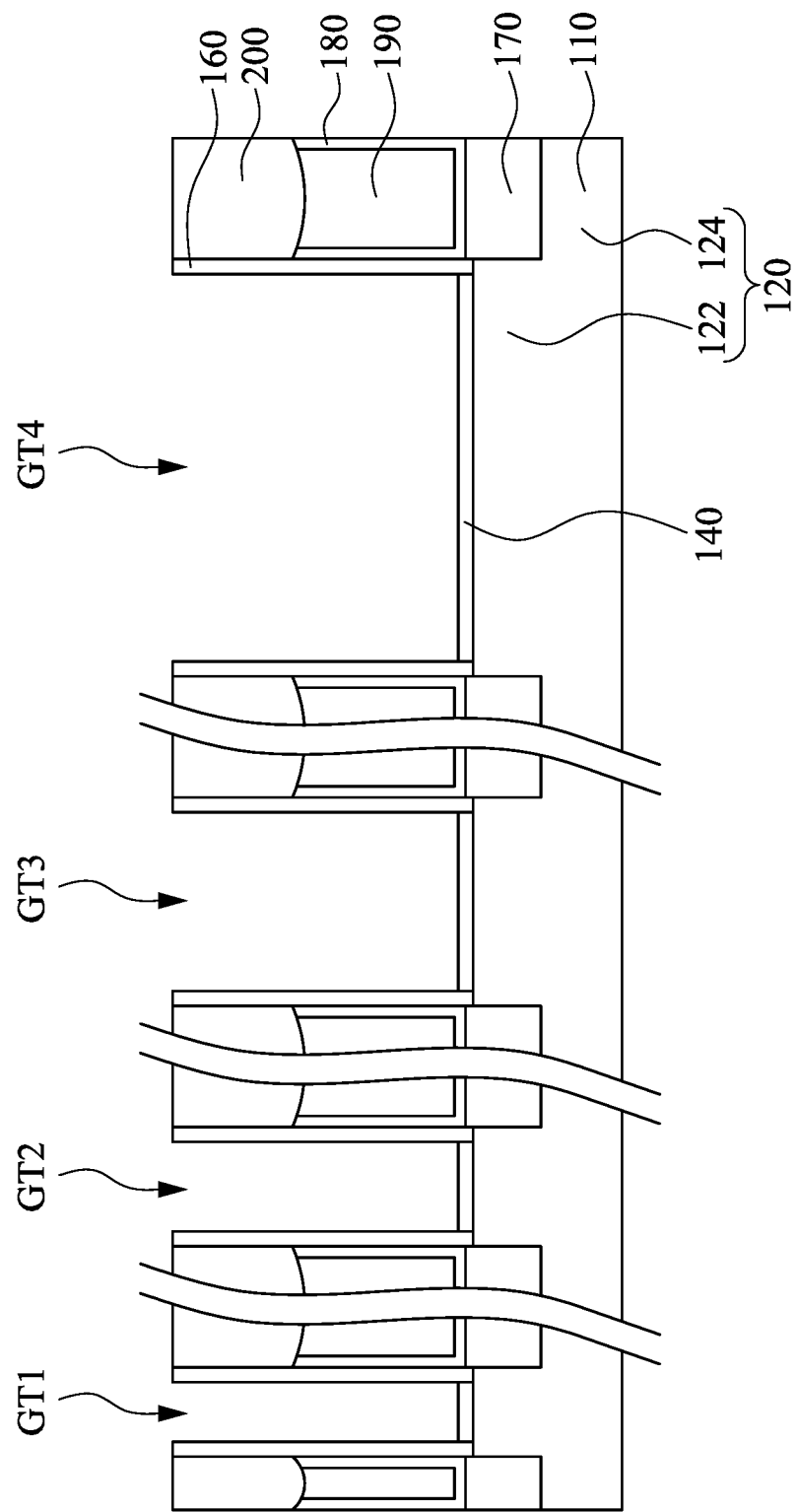

FIG. 10 illustrate removal of the dummy gate electrode layer 150. FIG. 11 illustrates a cross-sectional view taken along line 11-11 in FIG. 10. In some embodiments, the dummy gate electrode layer 150 (referring to FIG. 9) is removed to form gate trenches GT1-GT4 with the gate spacers 160 as their sidewalls, while the gate dielectric layer 140 remains in the bottom of the gate trenches GT1-GT4. The gate trenches GT1-GT4 may be defined by the gate spacers 160. In some embodiments, the dummy gate electrode layer 150 (referring to FIG. 9) is removed by a dry etching process, and the dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, the dry etching process is performed at a temperature in a range from about 20° C. to about 80° C. In some embodiments, the dry etching process is performed at a pressure in a range from about 1 mTorr to about 100 mTorr. In some embodiments, the dry etching process is performed at a power in a range from about 50 W to about 1500 W. Herein, the gate spacers 160 and the cap layer 200 may have a greater etch resistance to the dry etching process than that of the ILD layer 190, so as to protect the ILD layer 190 from being damaged by the dry etching process.

In some other embodiments, the gate dielectric layer 140 is removed during the formation of the gate trenches GT1-GT4. To be specific, the dummy gate structures DG1-DG4 (referring to FIG. 9) are removed by performing a first etching process and performing a second etching process after the first etching process. In some embodiments, the dummy gate electrode layer 150 is mainly removed by the first etching process, and the gate dielectric layer 140 is mainly removed by the second etching process. In some embodiments, the first etching process is a dry etching process as mentioned previously and the second etching process is a wet etching process. Herein, the gate spacers 160 and the cap layer 200 may has an higher etch resistance to the first etching process than that of the ILD layer 190 and that of the dummy gate electrode layer 150, and the gate spacers 160 and the cap layer 200 may has an higher etch resistance to the second etching process than that of the ILD layer 190 and that of the gate dielectric layer 140, so as to protect the ILD layer 190 from being damaged by the first and second etching processes.

Figure 12:
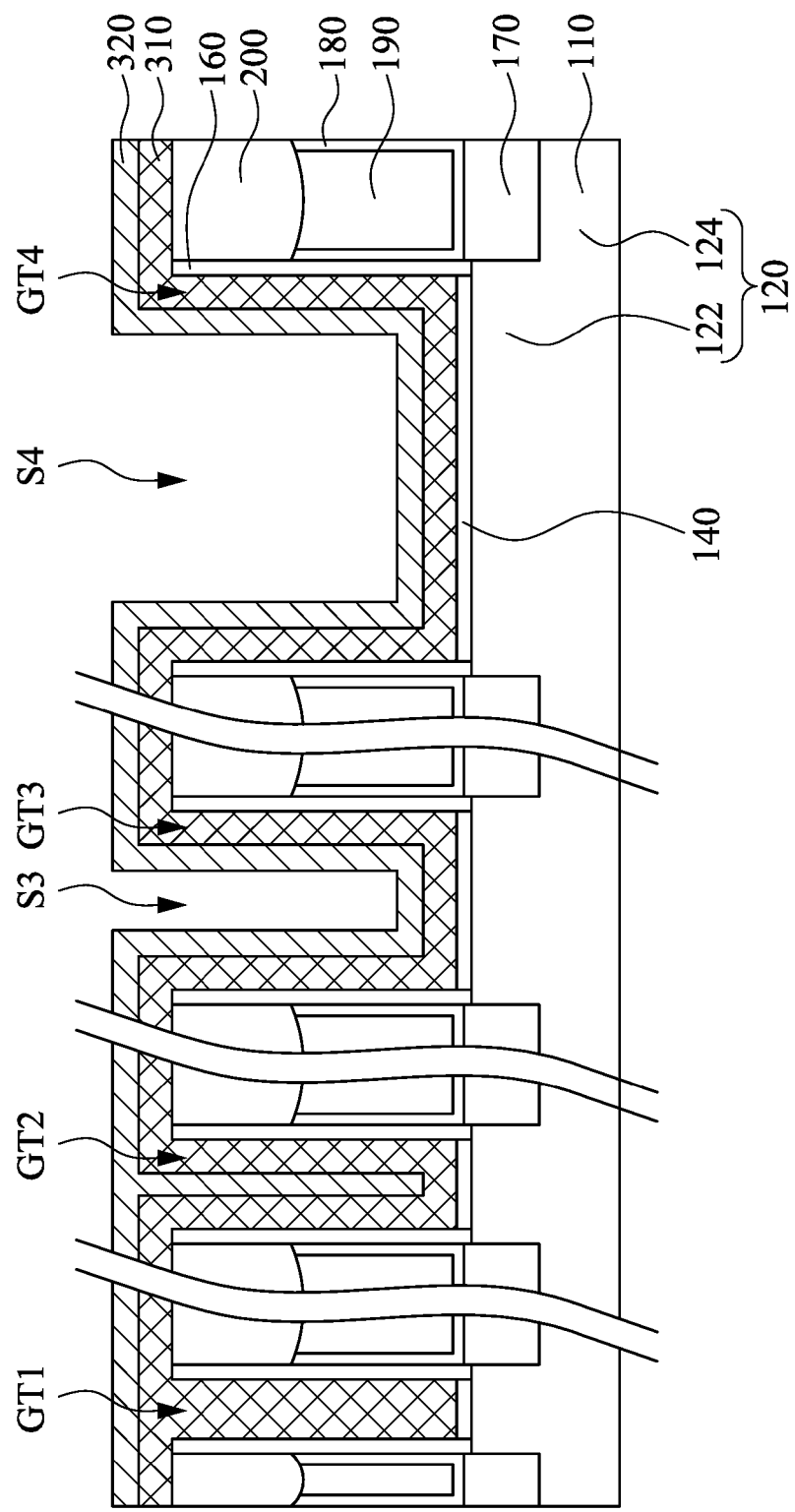
Figure 13:
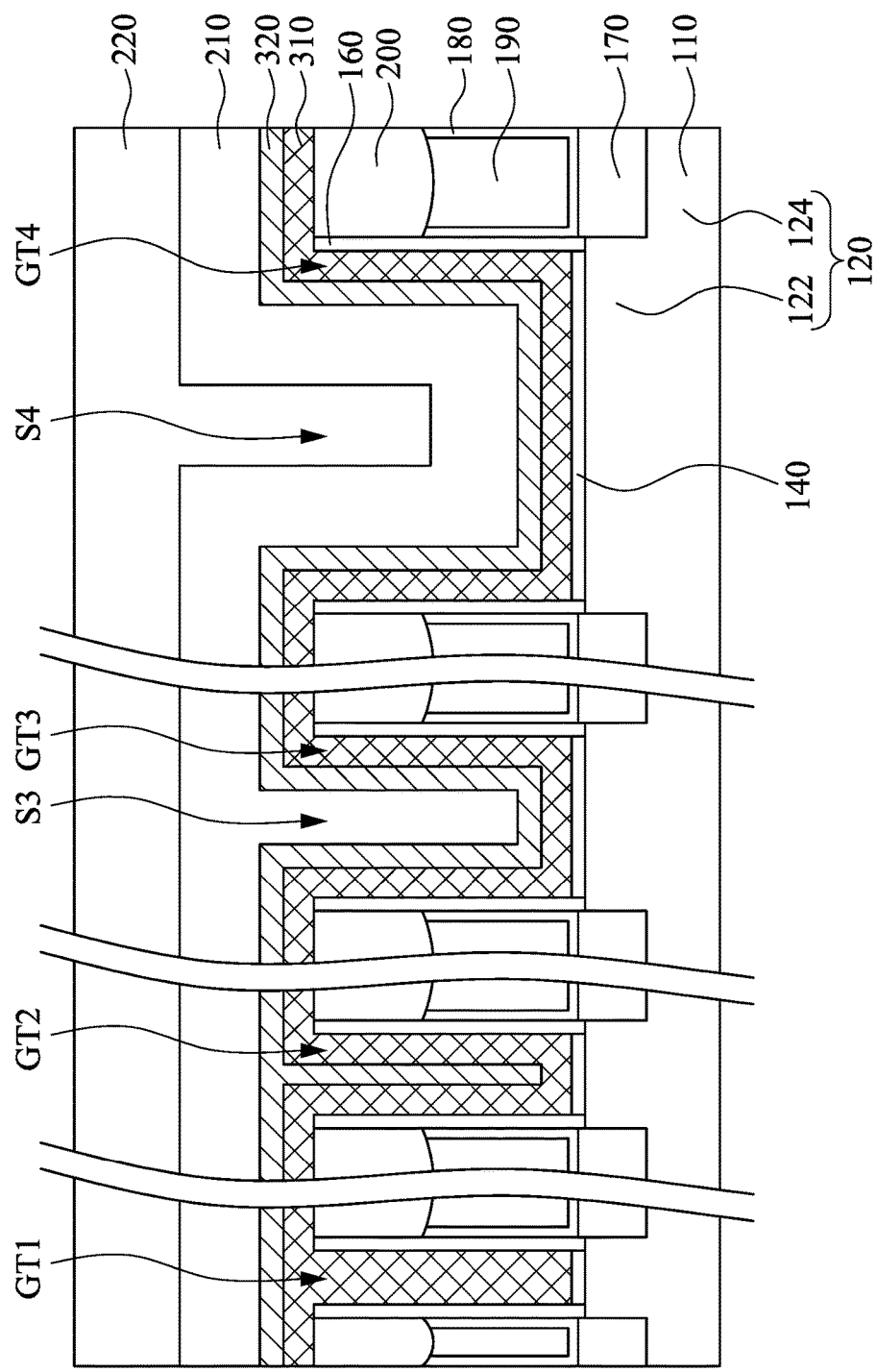
Figure 14:
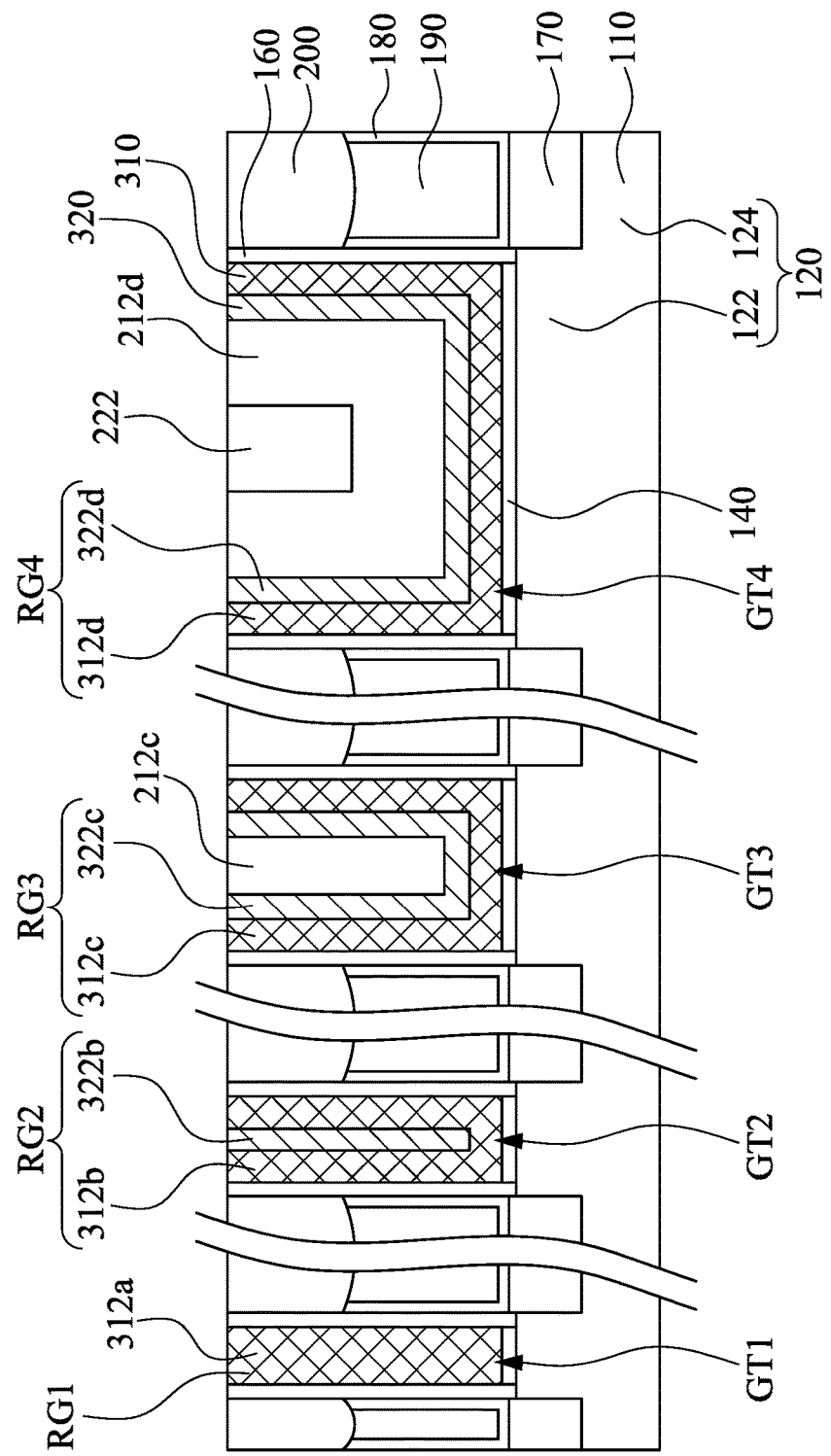

FIGS. 12 to 14 illustrate formation of replacement gates structures RG1-RG4. Referring to FIG. 12, one or more layers of work function conductive layer 310 are blanket formed over the gate dielectric layer 140, and a conductive layer 320 is blanket formed over the work function conductive layer 310. Herein, the work function conductive layer 310 and the gate dielectric layer 140 may be in combination referred to as a gate electrode layer in some embodiments. In some embodiments, a combination of the work function conductive layer 310 and the conductive layer 320 show different contours based on sizes of the gate trenches GT1-GT4. For example, the gate trench GT1 is filled up by the work function conductive layer 310, and the conductive layer 320 is not in the gate trench GT1. The gate trench GT2 is filled up with the work function conductive layer 310 and the conductive layer 320. The gate trench GT3 is blanket by the work function conductive layer 310 and the conductive layer 320, and leaves a recess S3 therein. The gate trench GT4 is blanket by the work function conductive layer 310 and the conductive layer 320, and leaves a recess S4 therein, in which the recess S4 is larger than the recess S3.

The work function conductive layer 310 includes work function metals to provide a suitable work function for the conductive layer 320. In some embodiments, the work function conductive layer 310 may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function conductive layer 310 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the work function conductive layer 310 is formed by ALD process.

The conductive layer 320 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. In some embodiments, the conductive layer 320 is formed by ALD process. The conductive layer 320 may have a thickness ranging from 5 nanometers to 20 nanometers.

In some other embodiments where the gate dielectric layer 140 is removed during the formation of the gate trenches GT1-GT4, a layer of gate dielectric is formed over the structures of FIG. 11, and then the work function conductive layer 310 and the conductive layer 320 are formed thereon subsequently.

Referring to FIG. 13, dielectric filling layers 210 and 220 are formed. The dielectric filling layer 210 may be conformally formed in the gate trenches GT3 and GT4, in which the recess S3 in the gate electrode layer is filled up by the dielectric filling layer 210. The dielectric filling layer 220 is formed over the dielectric filling layer 210, in which the recess S4 in the gate electrode layer is filled up by the dielectric filling layers 210 and 220. The dielectric filling layers 210 and 220 are not formed in the gate trenches GT1 and GT2. In some embodiments, the dielectric filling layer 210 is formed by ALD or other suitable techniques, and the dielectric filling layer 220 is formed by PECVD or other suitable techniques. The dielectric filling layers 210 and 220 may be made of oxide, silicon oxide, silicon nitride, silicon oxynitride, or other low-K dielectric materials. The materials of the dielectric filling layers 210 and 220 may be the same or different.

Then, excess portions of the dielectric filling layers 210 and 220, the work function conductive layer 310, and the conductive layer 320 outside the gate trench GT1-GT4 are removed. In some embodiments, the removal may include one or more CMP processes. For example, the removal may include a first CMP process to the dielectric filling layer 220, a second CMP process to the dielectric filling layer 210, and a third CMP process to the work function conductive layer 310 and the conductive layer 320. The dielectric filling layer 210 may have a higher resistance to the first CMP process than that of the dielectric filling layer 220, such that the first CMP process may stop at the dielectric filling layer 210. The conductive layer 320 may have a higher resistance to the second CMP process than that of the dielectric filling layer 210, such that the second CMP process may stop at the conductive layer 320. The cap layer 200 may have a higher resistance to the third CMP process than that of the work function conductive layer 310 and the conductive layer 320, such that the third CMP process may stop at the cap layer 200.

Referring to FIG. 14, after the removal, remaining portions of the work function conductive layer 310 form work function conductors 312a-312d, and remaining portions of the conductive layer 320 form conductors 322b-322d. Remaining portions of the dielectric filling layer 210 form dielectric features 212c-212d, and remaining portions of the dielectric filling layer 220 form a dielectric feature 222. Gate structures RG1-RG4 are formed after the removal, and the gate structures RG1-RG4 show different contours based on sizes of the gate trenches GT1-GT4. For example, the gate structure RG1 includes the work function conductor 312a, but not include any portion of the conductive layer 320. The gate structure RG2 includes the work function conductor 312b and the conductor 322b. The gate structure RG3 includes the work function conductor 312c and the conductor 322c, in which the dielectric feature 212c is over the gate structure RG3. The gate structure RG4 includes the work function conductor 312d and the conductor 322d, in which the dielectric features 212d and 222 are over the gate structure RG3. After the removal process, top end surfaces of the work function conductive layer 310 and the conductive layer 320 may be exposed, and the dielectric feature 212c-212d and 222 are embedded in the work function conductive layer 310 and the conductive layer 320 in the gate trenches GT3 and GT4. Herein, the dielectric features 212c-212d and 222 are separated from the spacers 160 by the gate structures RG3-RG4.

Figure 15:
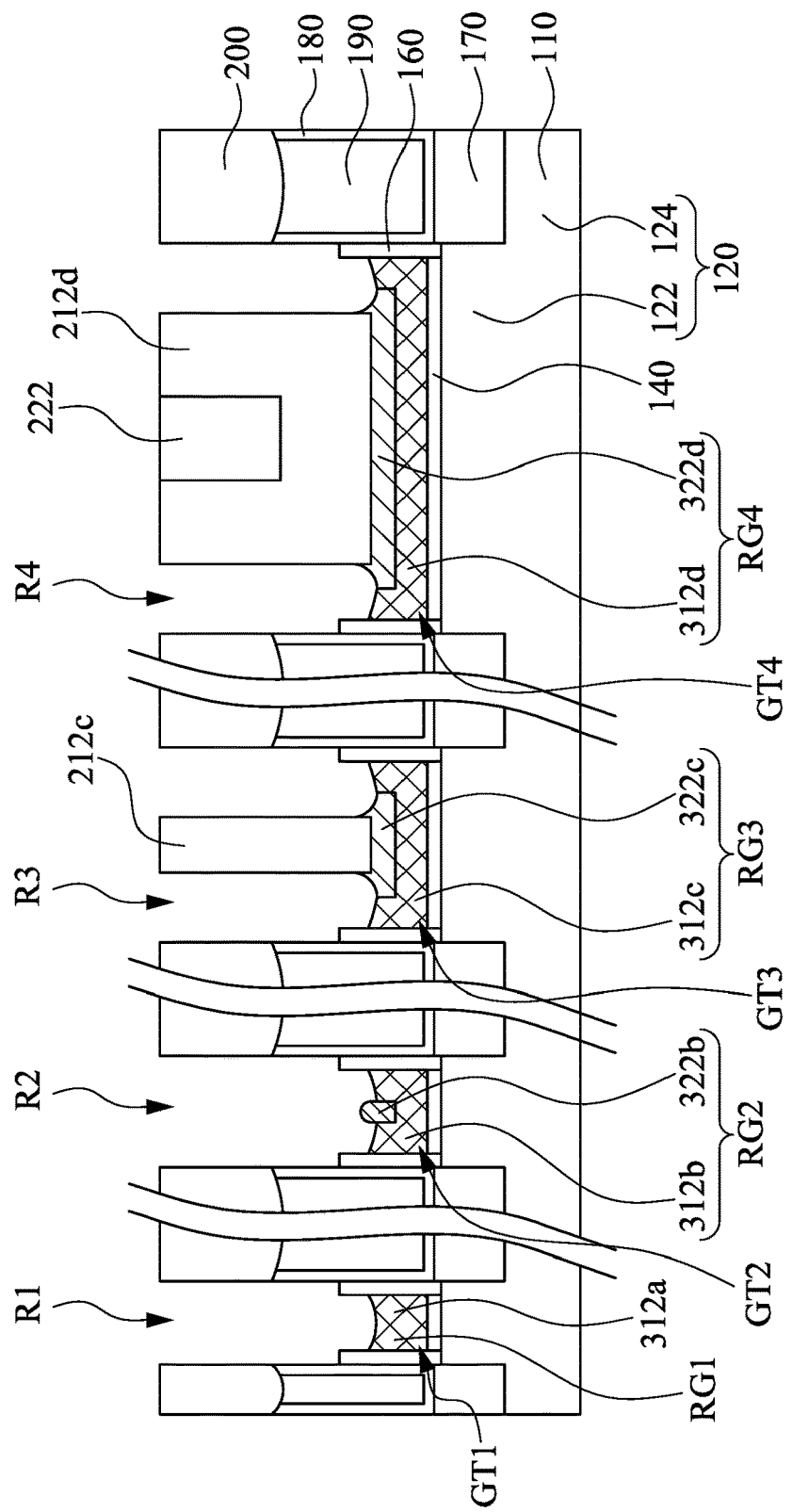

Reference is made to FIGS. 14 and 15. The work function conductive layer 310 and the conductive layer 320 of the gate structures RG1-RG4 are etched back from the top end surfaces of the work function conductive layer 310 and the conductive layer 320 while leaving a portion of the work function conductive layer 310 and the conductive layer 320 under the dielectric features 212c, 212d, and 222. The etching back begins from vertical portions of the work function conductive layer 310 and the conductive layer 320 abutting the dielectric feature 212c-212d, and leaves dielectric features 212c-212d and 222 protruding above the conductive layer 320. Herein, the cap layer 200, the CESL 180, and the gate spacers 160 have a higher etch resistance to the etching back than that of the work function conductive layer 310 and the conductive layer 320 of the gate structures RG1-RG4, such that recesses R1-R4 are formed in the gate trenches GT1-GT4 respectively. Furthermore, the dielectric features 212c and 212d have a higher etch resistance to the etching back than that of the work function conductive layer 310 and the conductive layer 320 of the gate structures RG3-RG4, such that the recesses R3-R4 are surround the dielectric features 212c and 212d respectively. In some embodiments, an etchant for the etching back may be fluoride-based or chloride-based. For example, for a dry etching, the etchant may be $BCl_3$, $Cl_2$, and $CF_4$, and for a wet etching, the etchant may be the etchant may be $NF_4$.

For example, referring to FIG. 15, vertical portions of the work function conductors 312a-312d and the conductors 322b-322d are removed, while leaving horizontal portions of the work function conductors 312a-312d and the conductors 322b-322d. The horizontal portions of the work function conductor 312c and the conductors 322c are on portions of sidewalls of the dielectric feature 212c, and horizontal portions of the work function conductor 312d and the conductors 322d are on portions of sidewalls of the dielectric feature 212d. In some embodiments, the work function conductors and the conductors may be in combination referred to as gate electrodes. The dielectric features 212c-212d is in contact with top surfaces of the gate electrodes. In some embodiments, portions of the gate electrodes covered by the dielectric features 212c-212d may have a thickness different from that portions of the gate electrodes exposed by the dielectric features 212c-212d. The gate electrodes extend across the semiconductor fins 120 and the dummy fin DF.

In some embodiments, it is less easy to etch the work function conductors 312a-312d than to etch the conductors 322b-322d. As a result, after the etching back, a top surface of the conductor 322b protrudes upward, and may be higher than a top end of the work function conductor 312b. In some embodiments, a top end of the conductor 322c is higher than a top end of the work function conductor 312c and adjacent to the dielectric feature 212c. In some embodiments, a top end of the conductor 322d is higher than a top end of the work function conductor 312d and adjacent to the dielectric features 212d and 222.

Afterwards, the gate spacers 160 are etched to reduce the height thereof, and top surfaces of the gate spacers 160 is substantially level with or higher than the top surfaces of the gate structures RG1-RG4. For example, an etchant for the etching the gate spacers 160 may be $HBr/NF_3$, $Cl_2/O_2/N_2/NF_3$, $CHF_3/H_2/Ar$.

Figure 16:
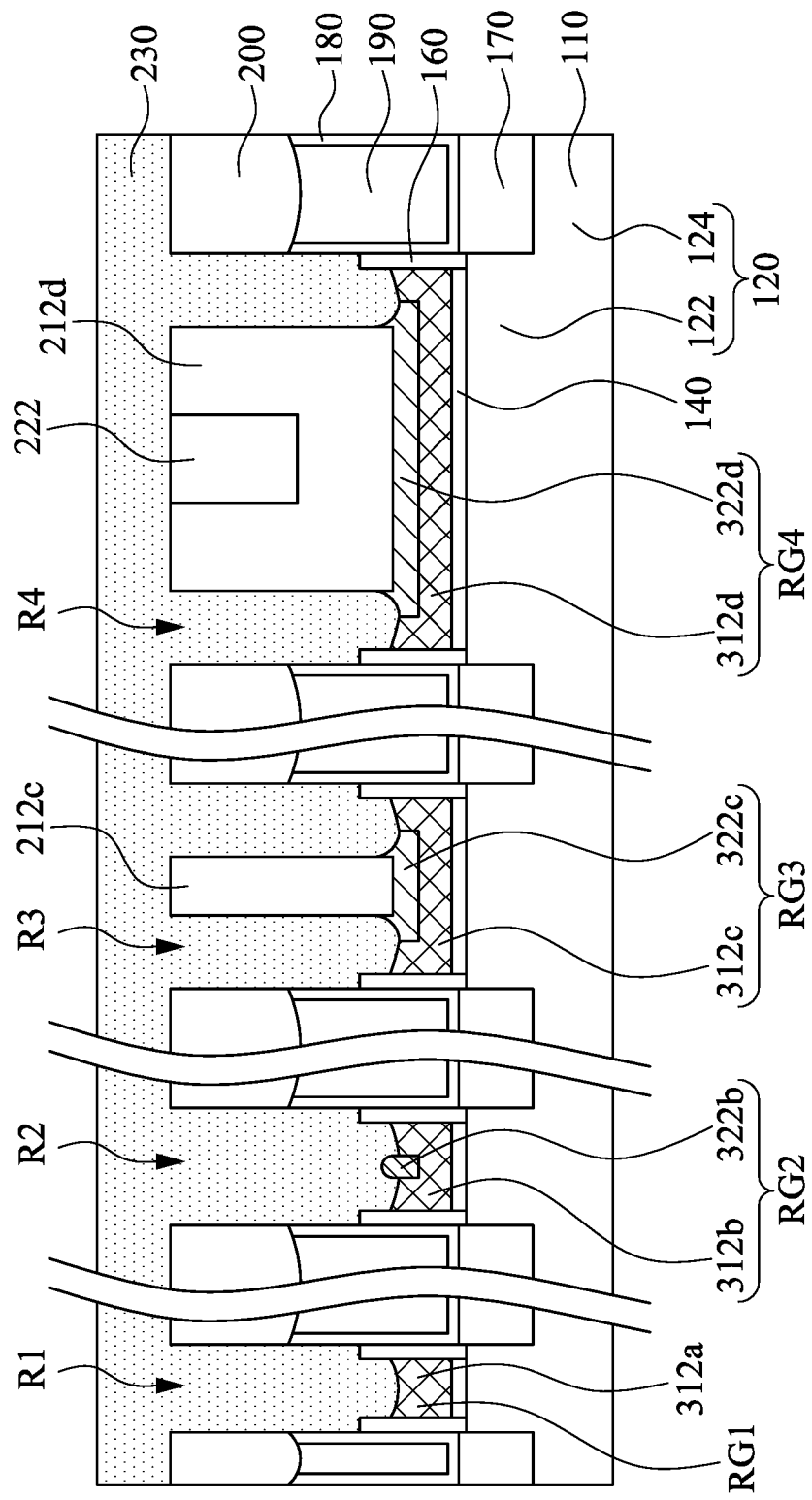

FIG. 16 illustrates the formation of a dielectric filling layer 230. The dielectric filling layer 230 fills the recesses R1-R4. The dielectric filling layer 230 may be made of oxide, silicon oxide, silicon nitride, silicon oxynitride, or other low-K dielectric materials. In some embodiments, the material of the dielectric filling layer 230 is the same as that of the material of the dielectric features 212c and 212d. In some embodiments, material of the dielectric filling layer 230 may be the same as that of the CESL 180 or the gate spacers 160. The dielectric filling layer 230 is between one of the dielectric features 212c-212d and one of the gate spacers 160. In some embodiments, the dielectric filling layer 230 may be referred to as a second dielectric feature. There may be an interface between the dielectric filling layer 230 and the dielectric features 212c-212d.

Figure 17:
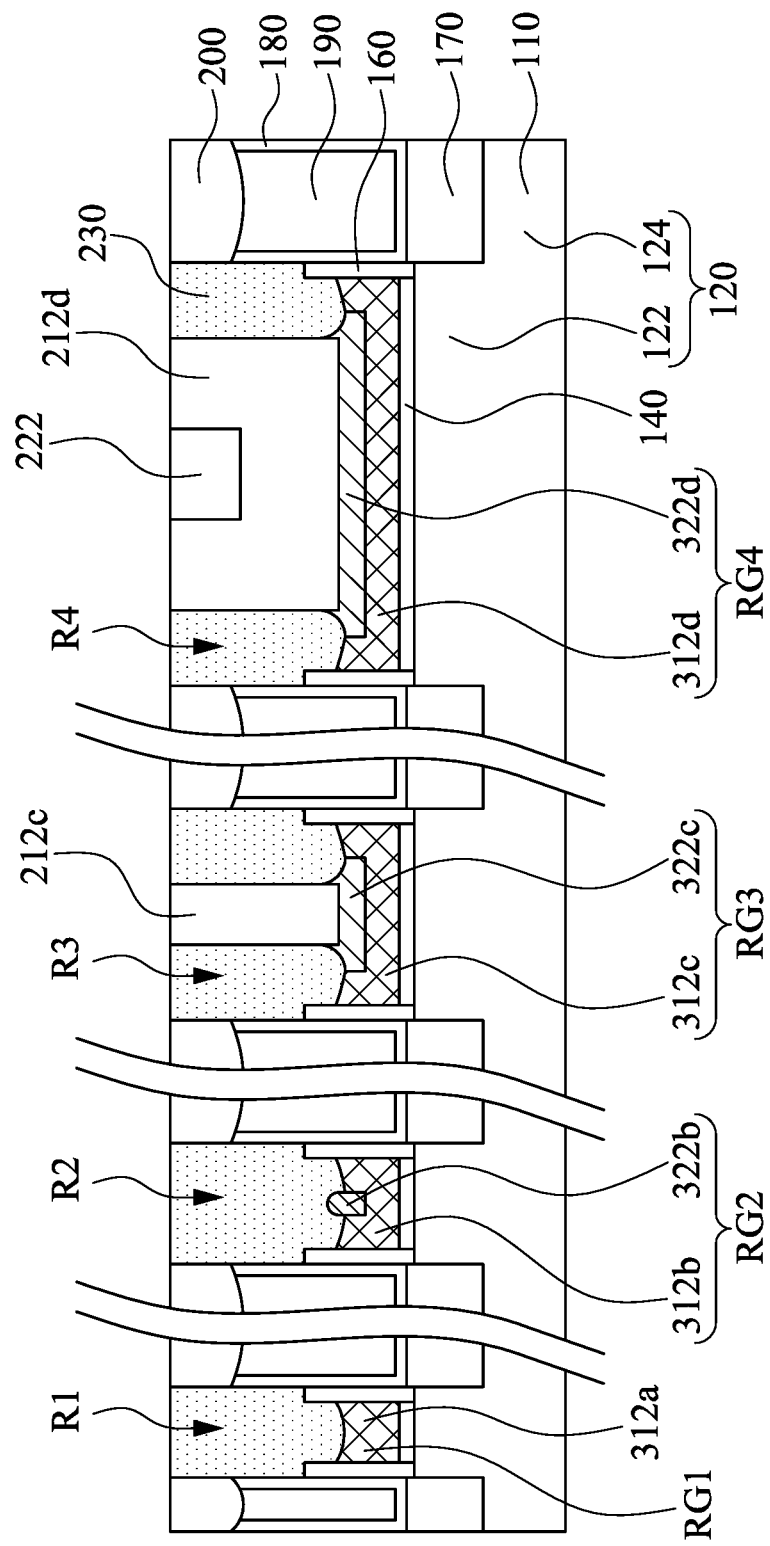

Reference is made to FIG. 17. A portion of the dielectric filling layer 230 outside the recesses R1-R4 is removed, for example, by a chemical mechanical polish (CMP) process. Furthermore, herein, a portion of the cap layer 200, a portion of the dielectric features 212c, 212d, and 222 may be removed by the CMP process.

Figure 18:
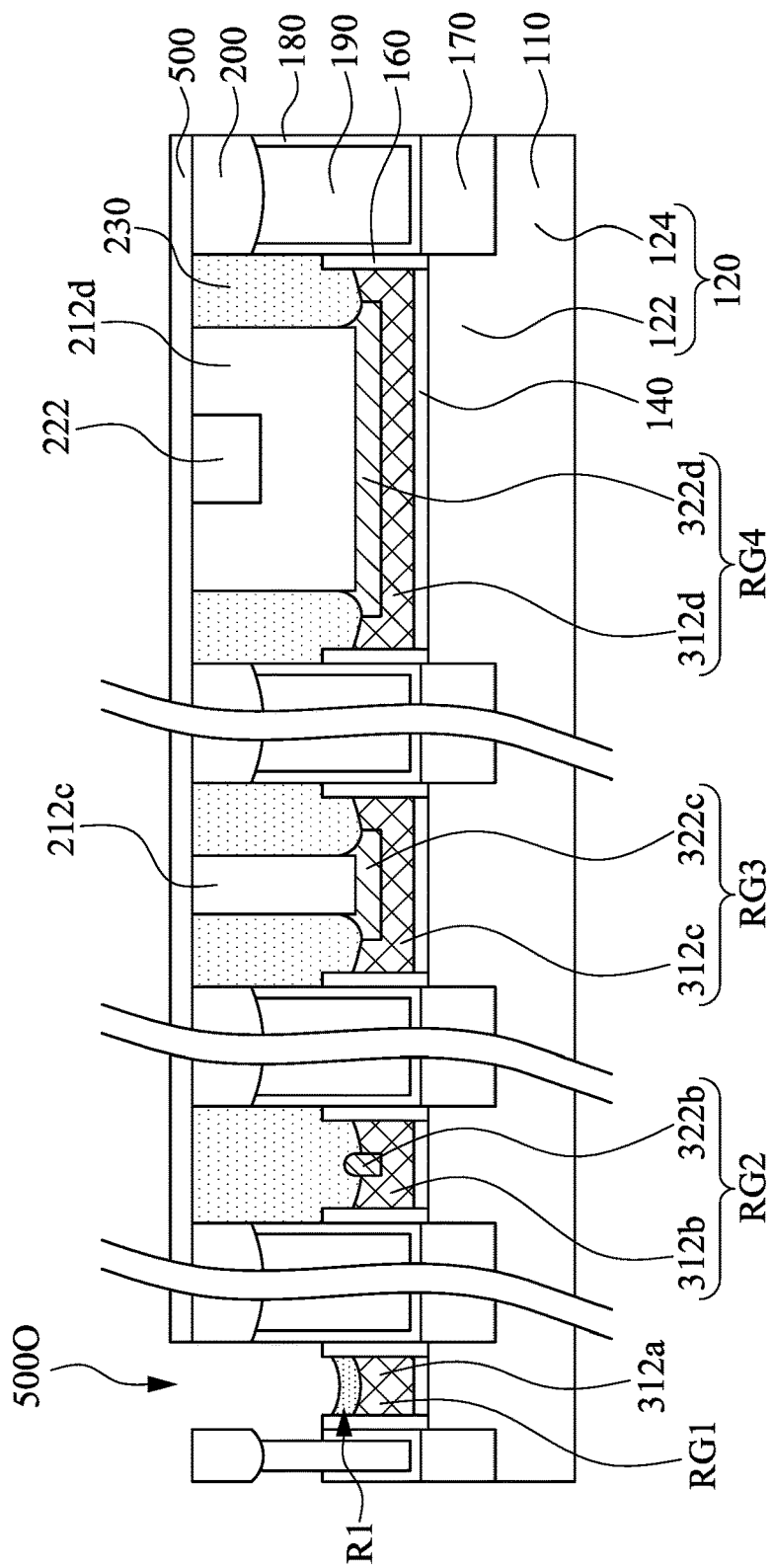

Reference is made to FIG. 18. A hard mask 500 is formed over the gate structures RG2-RG4, and has an opening 5000 over the gate structure RG1. An etching back process is performed to remove a portion of the dielectric filling layer 230 in the recess R1 using the hard mask 500 and the cap layer 200 as an etching mask, and another portion of the dielectric filling layer 230 remains in the recess R1. The hard mask 500 has a higher etch resistance to the etching back process than that of the dielectric filling layer 230. In some embodiments, since the material of the CESL 180 is the same as or similar to that of the dielectric filling layer 230, a portion of the CESL 180 is removed during the etching process.

Figure 19:
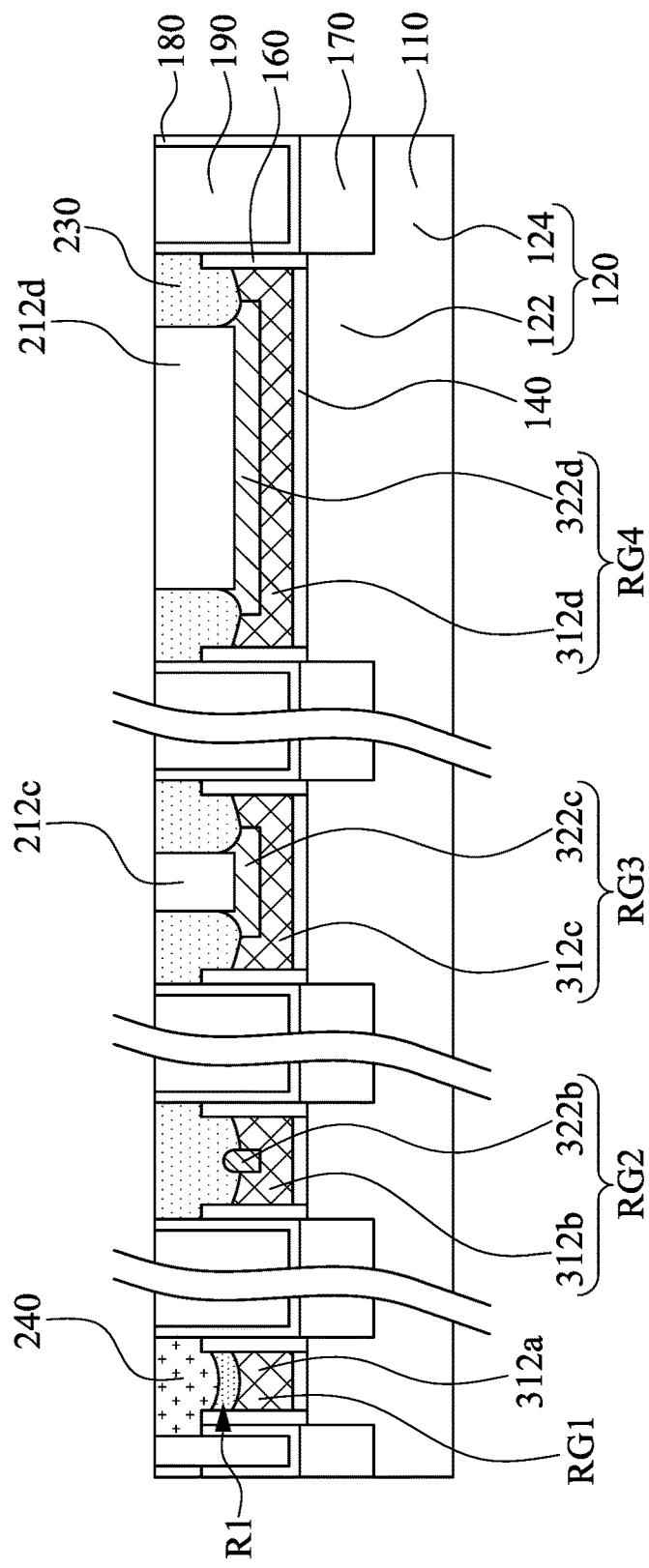

FIG. 19 illustrates the formation of a helmet 240. The helmet 240 fills the recess R1. The helmet 240 is not in the gate trenches GT2-GT4. The helmet 240 may be made of $ZrO_2$, $YSiO_x$, SiOC, or the combination thereof. The formation of the helmet 240 may include forming a helmet layer over the gate structures RG1-RG4, and performing a planarization thereon to remove a portion of the helmet layer. The helmet layer may have a thickness ranging from 5 nanometers to 50 nanometers. In some embodiments, the planarization may be a CMP process. In some embodiments, the hard mask 500 and the cap layer 200 may also be removed by the planarization.

Figure 20:
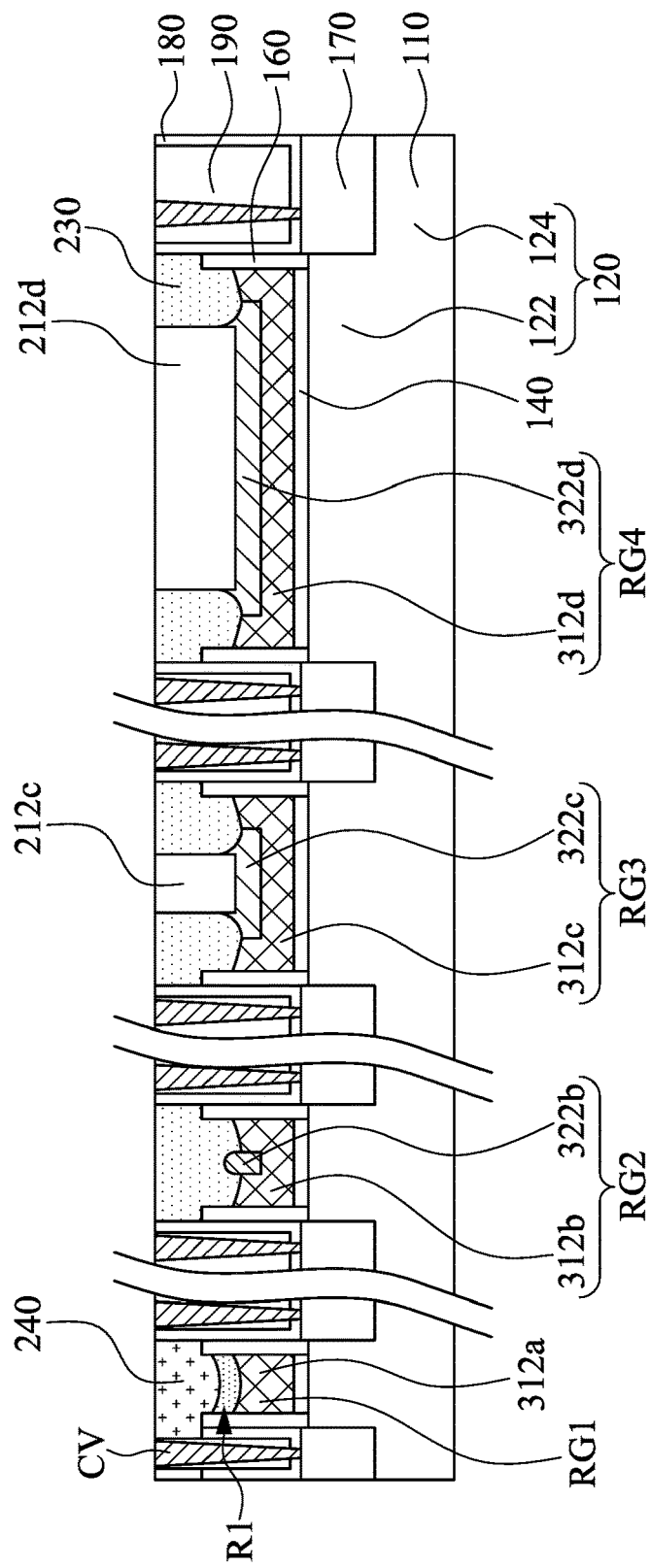

Referring to FIG. 20. Source/drain contacts CV connected to the epitaxial source/drain structures 170 are formed in the ILD layer 190 and the CESL 180. For example, a photoresist mask may be disposed over a top surface of the resulting structure of FIG. 19, contact holes are etched in the ILD layer 190 and the CESL 180 using the photoresist mask as an etch mask, and then conductors fill the contact holes and form the source/drain contacts CV. The photoresist mask is removed after the etching. In some embodiments, the source/drain contacts CV may be copper, aluminum, the like, and/or a combination thereof.

For a device with short channel length, such as the gate structure RG1, the portion of the ILD layer 190 adjacent to the gate structure RG1 may be narrow. In the absence of the helmet 240, when the contact holes are etched in the portion of the ILD layer 190 adjacent to the gate structure RG1, the spacers 160 and the gate structure RG1 may be damaged. In some embodiments of the present disclosure, the helmet 240 has a higher etch resistance to the etching the than ILD layer 190 than that of the dielectric filling layer 230, that of the spacers 160, and that of the work function conductor 312a, so that the helmet 240 may protect the spacers 160 and the gate structure RG1 from being damaged when the contact holes are etched.

Figure 21:
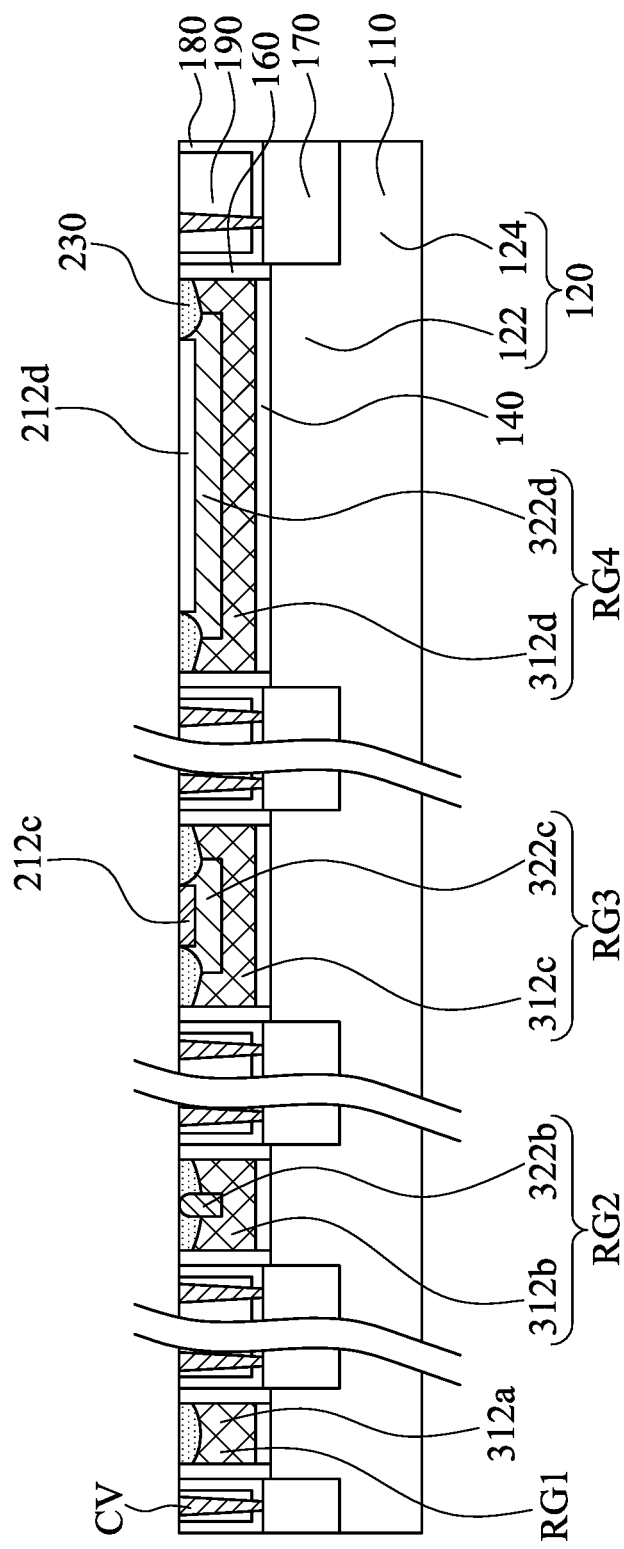

FIG. 21 illustrates the removal of the helmet 240. Another planarization is performed on the resulting structure of FIG. 20. In some embodiments, the planarization may be a CMP process. Herein, the helmet 240, a portion of the source/drain contacts CV, a portion of the ILD layer 190, a portion of the spacers 160, and a portion of the CESL 180 are removed.

Figure 22:
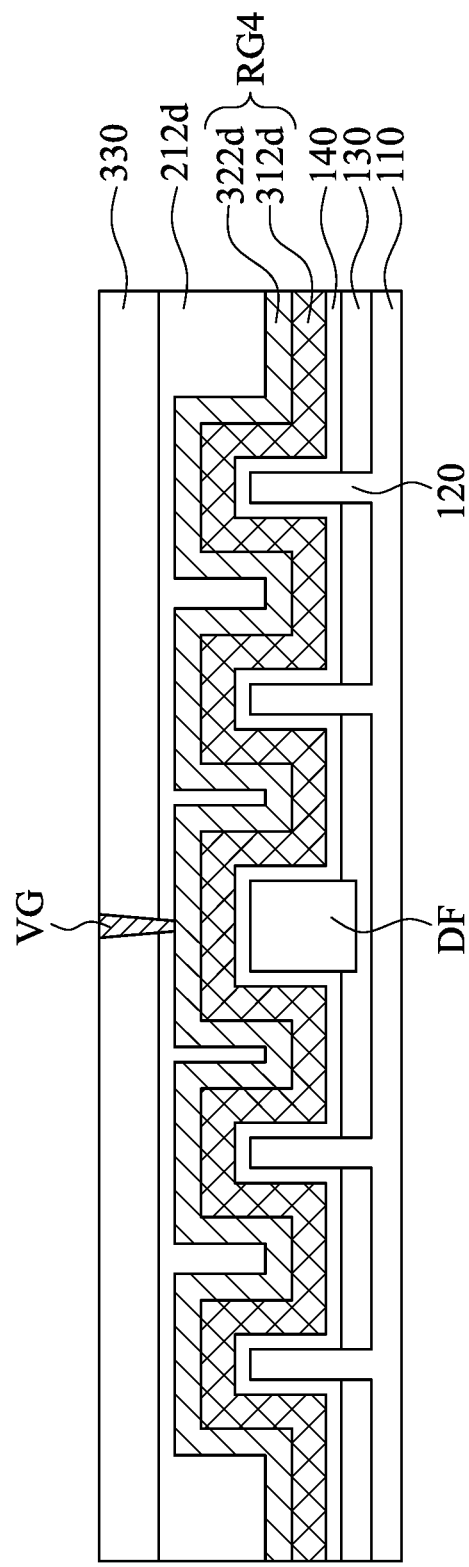

An interlayer dielectric (ILD) layer 330 is then disposed over and around the gate structures RG1-RG4, and gate contact vias VG are subsequently formed in the ILD layer 330 in contact with the gate structures RG1-RG4. The resulting structure is illustrated in FIG. 22. FIG. 22 is a cross-sectional view taken along a longitudinal direction of the gate structure RG4, illustrating the formation of at least one gate contact VG connected to the gate structure RG4. In some embodiments, the ILD layer 330 is over the dielectric feature 212d. The ILD layer 330 may have the same material as the underlying ILD layer 190 (referring to FIG. 10). The ILD layer 330 may be an extra low-k dielectric (ELK) layer, such as carbon doped silicon dioxide, may be an oxide, such as silicon oxide, and/or may be the like or a combination thereof. In some embodiments, the ILD layer 330 may be formed of a low-k dielectric material having a k value less than about 3.9. The k value of the ILD layer 330 may even be lower than about 2.8. In some embodiments, the gate contact vias VG may be copper, aluminum, the like, and/or a combination thereof. Formation of the ILD layer 330 and the gate contact VG includes, for example, depositing the ILD layer 330 using a spin-on process, etching contact holes in the ILD layer 330 to expose the respective gate structures RG1-RG4, filling the contact holes with metals using a suitable deposition technique, and performing a planarization process (e.g. CMP) to remove excess metals outside the via holes while leaving metals in the contact holes to serve as the gate contact vias VG.

The gate contact VG is exemplarily depicted over the dummy fin DF in FIG. 22 herein. In some embodiments, the gate contact VG may be formed between two neighboring semiconductor fins 120 (also referred to as active fins). If there is no dummy fin DF between the two neighboring semiconductor fins 120, the conductor 322d between the two neighboring semiconductor fins 120 would be in a low position which causes a deep gate contact VG. Formation of such a deep gate contact VG would suffer from some undesirable issues. For example, if there are other gate contacts landing over the semiconductor fins 120, these gate contacts would have depths less than that of the deep gate contact VG, and such a depth difference would result in loading effect of etching gate contact holes. However, since there is a dummy fin DF between the two neighboring semiconductor fins 120, the conductor 322d between the two neighboring semiconductor fins 120 can be raised by the dummy fin DF. Therefore, the depth of the gate contact VG can be reduced, and hence the loading effect of etching gate contact holes can be alleviated.

In some embodiments where the top surface of the dummy fin DF is substantially level with the top surface of the semiconductor fin 120, the top surface of the portion of the conductor 322d over the semiconductor fins 120 is level with the top surface of the portion of the conductor 322d over the dummy fin DF. As a result, the gate contacts over the semiconductor fins 120 may have a height equal to the gate contact VG over the dummy fin DF. Therefore, the loading effect of etching the gate contact hole over the dummy fin and the gate contact holes over the active fins can be alleviated.

Based on the above discussions, it can be seen that the present disclosure offers advantages over devices with different channel lengths. It is understood, however, that other embodiments may offer additional advantages, and not all advantages are necessarily disclosed herein, and that no particular advantage is required for all embodiments. One advantage is that for a long-channel device, the conformal gate metal and the dielectric filling layers wrapped by the conformal gate metal can reduce the size of the gate metal in the long channel device, and therefore size difference among the gate metals in long-channel, middle-channel, and short-channel devices is reduced, which is beneficial in alleviation of a loading effect of a metal gate etch back (MGEB) process (e.g. the process shown in FIG. 15). Another advantage is that for short-channel devices, the helmet may be beneficial in protecting the gate structures or other elements from being etched during the formation of the source/drain contacts over the source/drain regions. Yet another advantage is that the dummy fin DF may alleviate loading effect of the gate contact holes.

According to some embodiments of the present disclosure, method for manufacturing a semiconductor device includes forming a gate electrode layer in a gate trench; filling a recess in the gate electrode layer with a dielectric feature; and etching back the gate electrode layer from top end surfaces of the gate electrode layer while leaving a portion of the gate electrode layer under the dielectric feature.

According to some embodiments of the present disclosure, method for manufacturing a semiconductor device includes forming first and second dummy gate electrodes over a substrate, wherein the first dummy gate electrode has a width greater than a width of the second dummy gate electrode; forming first gate spacers on opposite sidewalls of the first dummy gate electrodes and second gate spacers on opposite sidewalls of the second dummy gate electrodes; removing the first and second dummy gate electrodes to form a first gate trench between the first gate spacers and a second gate trench between the second gate spacers; forming a gate electrode layer in the first and second gate trenches; forming a dielectric feature in a remaining portion of the first gate trench, wherein the dielectric feature is not formed in the second gate trench; and etching back the gate electrode layer in the first and second gate trenches.

According to some embodiments of the present disclosure, a semiconductor device includes a semiconductor substrate, gate spacers, a gate electrode, a first dielectric feature, and a second dielectric feature. The gate spacers are over the semiconductor substrate. The gate electrode is between the gate spacers. The first dielectric feature is between the gate spacers and in contact with a top surface of the gate electrode. The second dielectric feature is between the first dielectric feature and one of the gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a plurality of gate spacers over the semiconductor substrate;
   a gate electrode between the gate spacers;
   a first dielectric feature between the gate spacers and in contact with a top surface of the gate electrode; and
   a second dielectric feature between the first dielectric feature and one of the gate spacers, wherein a sidewall of the first dielectric feature is at least partially separated from the second dielectric feature, wherein the gate electrode comprises a gate conductor and a work function conductor surrounding the gate conductor, the gate conductor is in contact with the first dielectric feature, and the work function conductor is separated from the first dielectric feature.

2. The semiconductor device of claim 1, further comprising:
   a plurality of semiconductor fins over the semiconductor substrate; and
   a dummy fin between the semiconductor fins, wherein the gate electrode extends across the semiconductor fins and the dummy fin.

3. The semiconductor device of claim 2, wherein the first dielectric feature extends across the semiconductor fins and the dummy fin.

4. The semiconductor device of claim 2, further comprising:
   a gate contact via over the dummy fin and connected to the gate electrode.

5. The semiconductor device of claim 1, further comprising:
   a gate contact via in the first dielectric feature and connected to the gate electrode.

6. The semiconductor device of claim 1, wherein the work function conductor is in contact with the second dielectric feature.

7. The semiconductor device of claim 1, wherein the gate conductor has a portion between the first dielectric feature and the second dielectric feature.

8. The semiconductor device of claim 1, wherein a top surface of the first dielectric feature and a top surface of the second dielectric feature are coplanar.

9. The semiconductor device of claim 1, wherein the first dielectric feature comprises a material the same as that of the second dielectric feature.

10. The semiconductor device of claim 1, wherein the gate conductor is in contact with the sidewall of the first dielectric feature.

11. The semiconductor device of claim 1, wherein a bottom surface of the second dielectric feature is over the top surface of the gate electrode.

12. A semiconductor device, comprising:
    a semiconductor substrate;
    a plurality of gate spacers over the semiconductor substrate;
    a gate conductor between the gate spacers;
    a work function conductor surrounding the gate conductor; and
    a first dielectric feature between the gate spacers and over the gate conductor, wherein the first dielectric feature is separated from the work function conductor and the gate conductor has a first portion higher than a bottom surface of the first dielectric feature.

13. The semiconductor device of claim 12, further comprising:
    a second dielectric feature over the work function conductor and surrounding the first dielectric feature.

14. The semiconductor device of claim 13, wherein the first portion of the gate conductor is between the first dielectric feature and the second dielectric feature.

15. The semiconductor device of claim 14, wherein the gate conductor has a second portion between the first dielectric feature and the work function conductor, and the second portion of the gate conductor is connected with the first portion of the gate conductor.

16. A semiconductor device, comprising:
    a semiconductor substrate;
    a plurality of first gate spacers over the semiconductor substrate;
    a first gate electrode between the first gate spacers; and
    a first dielectric feature between the first gate spacers and over the first gate electrode; and
    a second dielectric feature separating the first dielectric feature from the first gate spacers, wherein a bottom surface of the second dielectric feature is in contact with a top surface of the first gate electrode.

17. The semiconductor device of claim 16, further comprising:
    a plurality of second gate spacers over the semiconductor substrate;
    a second gate electrode between the second gate spacers; and a third dielectric feature between the second gate spacers and over the second gate electrode, wherein the third dielectric feature is in contact with the second gate spacers.

18. The semiconductor device of claim 17, wherein a distance between the first gate spacers is greater than a distance between the second gate spacers.

19. The semiconductor device of claim 17, wherein the third dielectric feature covers the second gate electrode.

20. The semiconductor device of claim 16, wherein the first gate electrode surrounds the first dielectric feature.

* * * * *